United States Patent
Das et al.

(10) Patent No.: US 11,636,324 B2
(45) Date of Patent: Apr. 25, 2023

(54) GAUSSIAN SYNAPSES FOR PROBABILISTIC NEURAL NETWORKS

(71) Applicant: THE PENN STATE RESEARCH FOUNDATION, University Park, PA (US)

(72) Inventors: Saptarshi Das, State College, PA (US); Amritanand Sebastian, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 17/753,574

(22) PCT Filed: Aug. 12, 2020

(86) PCT No.: PCT/US2020/045969
§ 371 (c)(1),
(2) Date: Mar. 8, 2022

(87) PCT Pub. No.: WO2021/050194
PCT Pub. Date: Mar. 18, 2021

(65) Prior Publication Data
US 2022/0269933 A1    Aug. 25, 2022

Related U.S. Application Data

(60) Provisional application No. 62/898,583, filed on Sep. 11, 2019.

(51) Int. Cl.
*G06N 3/063* (2006.01)
*G06N 3/04* (2006.01)
*H01L 27/092* (2006.01)

(52) U.S. Cl.
CPC ......... *G06N 3/0635* (2013.01); *G06N 3/0472* (2013.01); *H01L 27/092* (2013.01)

(58) Field of Classification Search
CPC ... G06N 3/0635; G06N 3/0472; H01L 27/092
(Continued)

(56) References Cited

U.S. PATENT DOCUMENTS

2011/0187412 A1*  8/2011  Ma .................... H01L 29/42384
                                                257/E29.264
2015/0137075 A1*  5/2015  Heo .................. H01L 29/66045
                                                257/29
(Continued)

FOREIGN PATENT DOCUMENTS

KR    20140037702 A    3/2014
WO    2016200971 A1    12/2016
WO    2018195761 A1    11/2018

OTHER PUBLICATIONS

International Search Report and Written Opinion for PCT/US2020/045969 filed Aug. 12, 2020 dated Oct. 29, 2020.

*Primary Examiner* — Tong-Ho Kim
(74) *Attorney, Agent, or Firm* — Buchanan Ingersoll & Rooney PC

(57) ABSTRACT

Embodiments relate to a Gaussian synapse device configured so that its transfer characteristics resemble a Gaussian distribution. Embodiments of the Gaussian synapse device include an n-type field-effect transistor (FET) and p-type FET with a common contact so that the two FETs are connected in series. Some embodiments include a global back-gate contact and separate top-gate contact to obtain dual-gated FETs. Some embodiments include two different 2D materials used in the channel to generate the two FETs, while some embodiments use a single ambipolar transport material. In some embodiments, the dual-gated structure is used to dynamically control the amplitude, mean and standard deviation of the Gaussian synapse. In some embodiments, the Gaussian synapse device can be used as a
(Continued)

probabilistic computational device (e.g., used to form a probabilistic neural network).

19 Claims, 22 Drawing Sheets

(58) Field of Classification Search
USPC .......................................................... 706/33
See application file for complete search history.

(56) References Cited

U.S. PATENT DOCUMENTS

2018/0315852 A1  11/2018  Ozkan et al.
2018/0374962 A1  12/2018  Das

* cited by examiner

GAUSSIAN SYNAPSES FOR PROBABILISTIC NEURAL NETWORKS

CROSS-REFERENCE TO RELATED APPLICATIONS

This application is a U.S. national stage application under 35 U.S.C. § 371 for International Patent Application No. PCT/US2020/045969, filed Aug. 12, 2020, which is related to and claims the benefit of priority of U.S. provisional application 62/898,583, filed Sep. 11, 2019, the entire contents of each is incorporated herein by reference.

FIELD OF THE INVENTION

Embodiments relate to a device configured so that its transfer characteristics resemble a Gaussian distribution. Embodiments of the Gaussian synapse device include an n-type field-effect transistor (FET) and a p-type FET connected in series. Some embodiments include two different 2D materials, namely, $MoS_2$ and black phosphorus (BP) used as the semiconducting channel to generate the two FETs. Some embodiments include a global back-gate contact and independent top-gate contacts to result in dual-gated device structures. Some embodiments include the use of dual-gated structures to dynamically control the amplitude, mean and standard deviation of the Gaussian synapse. Some embodiments include two different 2D materials used as the channel to fabricate n-type and p-type FETs, while some embodiments use a single ambipolar transport material with n-type and p-type conduction. In some embodiments, the Gaussian synapse device can be used as a probabilistic computational device (e.g., used to form a probabilistic neural network).

BACKGROUND OF THE INVENTION

The recent decline in energy, size, and complexity scaling of traditional von Neumann architecture has resurrected much interest in brain-inspired neuromorphic computing. The neurobiological architecture of the mammalian nervous system uses probabilistic and analog computational primitives in order to accomplish adaptive functionalities, such as pattern recognition and pattern classification that form the foundation for mammalian problem solving and decision making. Artificial neural networks (ANNs) deploying components of deterministic digital logic or analog devices, such as memristors, coupled oscillators, and various target components to emulate neural spiking, neural transmission, and neural plasticity, indeed achieve complexity scaling, but fail to address energy and size scaling at the device level. Furthermore, fundamental challenges associated with ANNs such as slow learning, incremental adaption, and false convergence can ultimately limit the complexity scaling as well.

BRIEF SUMMARY OF THE INVENTION

Embodiments relate to a Gaussian synapse based on heterostructures of atomically thin two-dimensional (2D) layered materials (e.g., $MoS_2$ and black phosphorus (BP) field effect transistors (FETs)) as analog and probabilistic computational devices that enable hardware implementation of statistical neural networks. Some embodiments include two different 2D materials used as the channel to generate the two FETs, while some embodiments use a single ambipolar transport material to generate the two FETs. It should be noted that embodiments of the Gaussian synapse device can be configured to use only two transistors, which significantly improves the area and energy efficiency at the device level and provides cascading benefits at the circuit, architecture, and system levels. Some embodiments include dual-gated FETs. Threshold engineering in dual gated FETs facilitates complete tunability of amplitude, mean, and standard deviation of the Gaussian synapse. Simulation results suggest seamless classification of brainwave patterns ($\delta$, $\theta$, $\alpha$, $\beta$, $\gamma$) by exploiting a Gaussian synapse based probabilistic neural network (PNN).

In an exemplary embodiment, a Gaussian synapse device includes a substrate having a source contact and a drain contact. The device has two channels formed between the source contact and the drain contact. The source contact connects to a p-type channel. The drain contact connects to an n-type channel. The p-type and n-type channels are connected in series.

In some embodiments, the Gaussian synapse device includes a common contact, a first channel formed between the source contact and the common contact, forming a p-type field-effect transistor (FET), and second channel formed between the drain contact and the common contact, forming an n-type FET In some embodiments the first channel includes a first p-type atomically thin two-dimensional (2D) layered material and the second channel includes a second n-type atomically thin 2D layered material.

In some embodiments, the first p-type atomically thin 2D layered material comprises black phosphorus and the second n-type atomically thin 2D layered material comprises $MoS_2$.

In some embodiments, both channels include ambipolar transport material.

In some embodiments, the ambipolar transport material is $WSe_2$.

In some embodiments, the Gaussian synapse device includes a back-gate.

In some embodiments, the Gaussian synapse device includes at least one of: a first top-gate formed on the p-type FET; and a second top-gate formed on the n-type FET.

In some embodiments, the Gaussian synapse includes at least one top-gated transistor in Gaussian synapse device.

In some embodiments, the p-type FET is a tunneling field effect transistor (TFET) and the n-type FET is a TFET.

In an exemplary embodiment, a method of forming a Gaussian synapse device involves: forming a dielectric substrate having an upper surface and a lower surface; forming a source contact on the upper surface; forming a drain contact on the upper surface; forming two channels between the source contact and the drain contact such that one channel generates a p-type field effect transistor (FET) and the other channel generates an n-type FET, wherein the p-type FET and the n-type FET are connected in series.

In some embodiments, the method further involves: forming a common contact on the upper surface; forming a first channel between the source contact and the common contact; and forming a second channel between the drain contact and the common contact.

In some embodiments, forming the first channel involves generating a first p-type atomically thin two-dimensional (2D) layered material. Forming the second channel involves generating a second n-type atomically thin 2D layered material.

In some embodiments, the first p-type atomically thin 2D layered material is black phosphorus. The second n-type atomically thin 2D layered material is $MoS_2$.

In some embodiments, both channels are formed using a single ambipolar transport material.

In some embodiments, the ambipolar transport material is $WSe_2$.

In some embodiments, the method further involves forming a back-gate on the lower surface.

In some embodiments, the method further involves forming at least one of: a first top-gate on the p-type FET; and a second top-gate on the n-type FET.

In some embodiments, the method further involves tuning the mean, the standard deviation, and the amplitude of the Gaussian shaped transfer characteristics of the Gaussian synapse device via adjustment of the top-gate voltage for the first top-gate and the top gate voltage for the second top-gate.

Further features, aspects, objects, advantages, and possible applications of the present invention will become apparent from a study of the exemplary embodiments and examples described below, in combination with the Figures, and the appended claims.

BRIEF DESCRIPTION OF THE FIGURES

The above and other objects, aspects, features, advantages, and possible applications of the present invention will be more apparent from the following more particular description thereof, presented in conjunction with the following drawings. It should be understood that like reference numbers used in the drawings may identify like components.

DETAILED DESCRIPTION OF THE INVENTION

Figure 1:
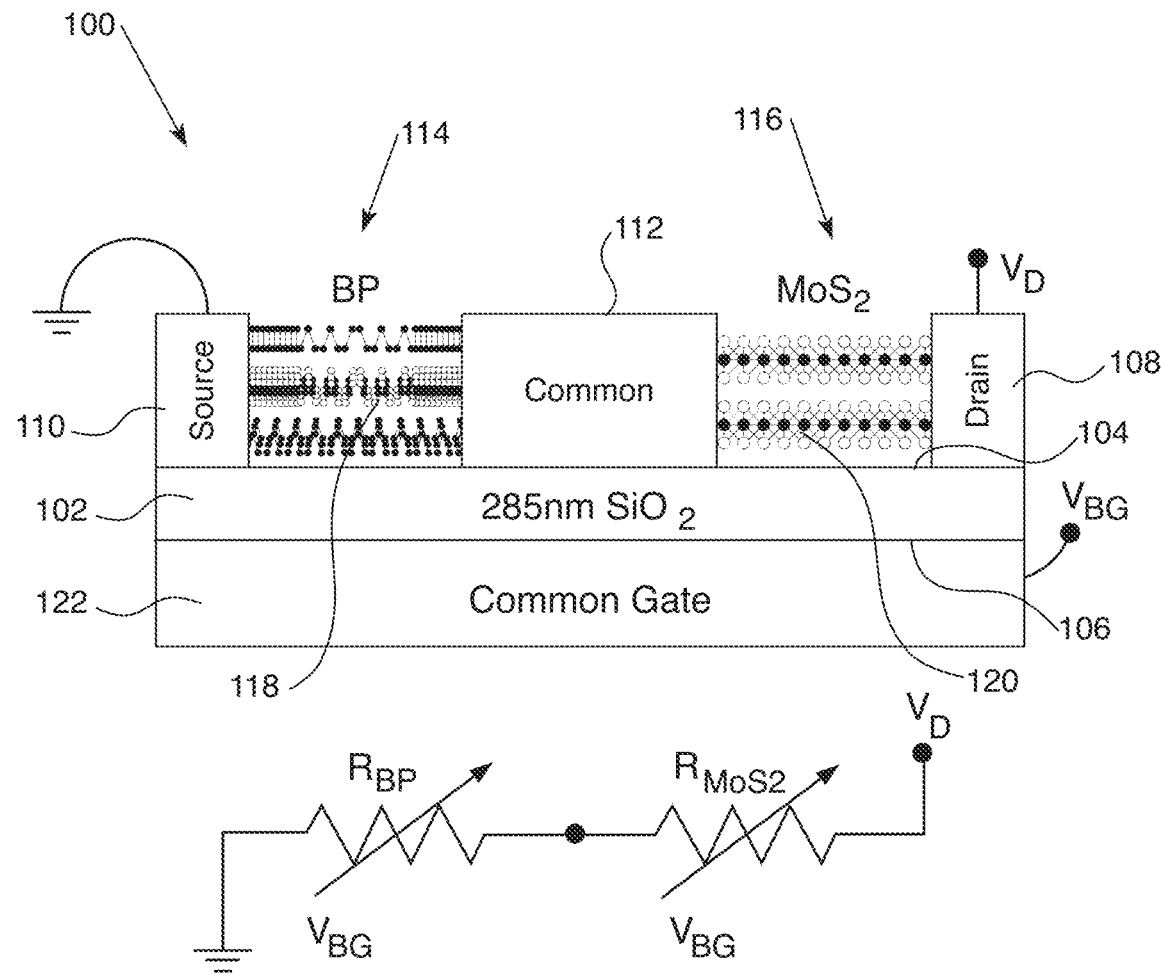
FIG. 1 shows a schematic of an embodiment of a Gaussian synapse device.

The following description is of an embodiment presently contemplated for carrying out the present invention. This description is not to be taken in a limiting sense but is made merely for the purpose of describing the general principles and features of the present invention. The scope of the present invention should be determined with reference to the claims.

Embodiments relate to a Gaussian synapse device 100 (a field-effect transistor in which the transfer characteristics i.e. drain current ($I_{DS}$) versus back-gate voltage ($V_{BG}$) resemble a Gaussian distribution). In some embodiments, the Gaussian synapse device 100 can be used as a probabilistic computational device (e.g., used to form a probabilistic neural network). The Gaussian synapse device 100 can include a substrate comprising of 285 nm $SiO_2$ dielectric 102 and $p^{++}Si$ global back-gate contact 106. The substrate 102 can have an upper surface 104 and a lower surface 106. A drain contact 108 can be formed on a portion of the upper surface 104. A source contact 110 can be formed on a portion of the upper surface 104. A common contact 112 can be formed on a portion of the upper surface 104. The common contact 112 can be used to form a first field effect transistor (FET) 114 between it and the source contact 110 and a second FET 116 between it and the drain contact 108. A first channel 118 is formed between the source contact 110 and the common contact 112. The first channel 118 can be a p-type channel (e.g., black phosphorus (BP) channel), thereby forming a p-type FET 114 as the first FET 114. A second channel 120 is formed between the drain contact 108 and the common contact 112. The second channel 120 can be an n-type channel (e.g., $MoS_2$ channel), thereby forming an n-type FET 116 as the second FET 116. In some embodiments, a back-gate contact 122 can be formed on at least a portion of the lower surface 106. Such an architecture configuration can generate a device 100 with the n-type FET 116 (e.g., $MoS_2$ FET 116) and the p-type FET 114 (e.g., BP FET 114) connected in series. Any of the source contacts 110, drain contacts 108, common contacts 112, or back-gate contacts 122 can be formed via metals, semi-metal, or heavily doped semiconducting materials.

FIG. 1 shows a schematic of an embodiment of the Gaussian synapse device 100. The exemplary Gaussian synapse device 100 is a two-transistor device based on heterogeneous integration of an n-type MoS$_2$ FET 116 and a p-type BP FET 114 that are back-gated. The equivalent circuit diagram (also shown in FIG. 1) for the Gaussian synapse device 100 can be shown as two variable resistors in series. The two variable resistors, i.e. R$_{MoS2}$ and R$_{BP}$, correspond to the MoS$_2$ FET 116 and the BP FET 114, respectively.

Figure 2:
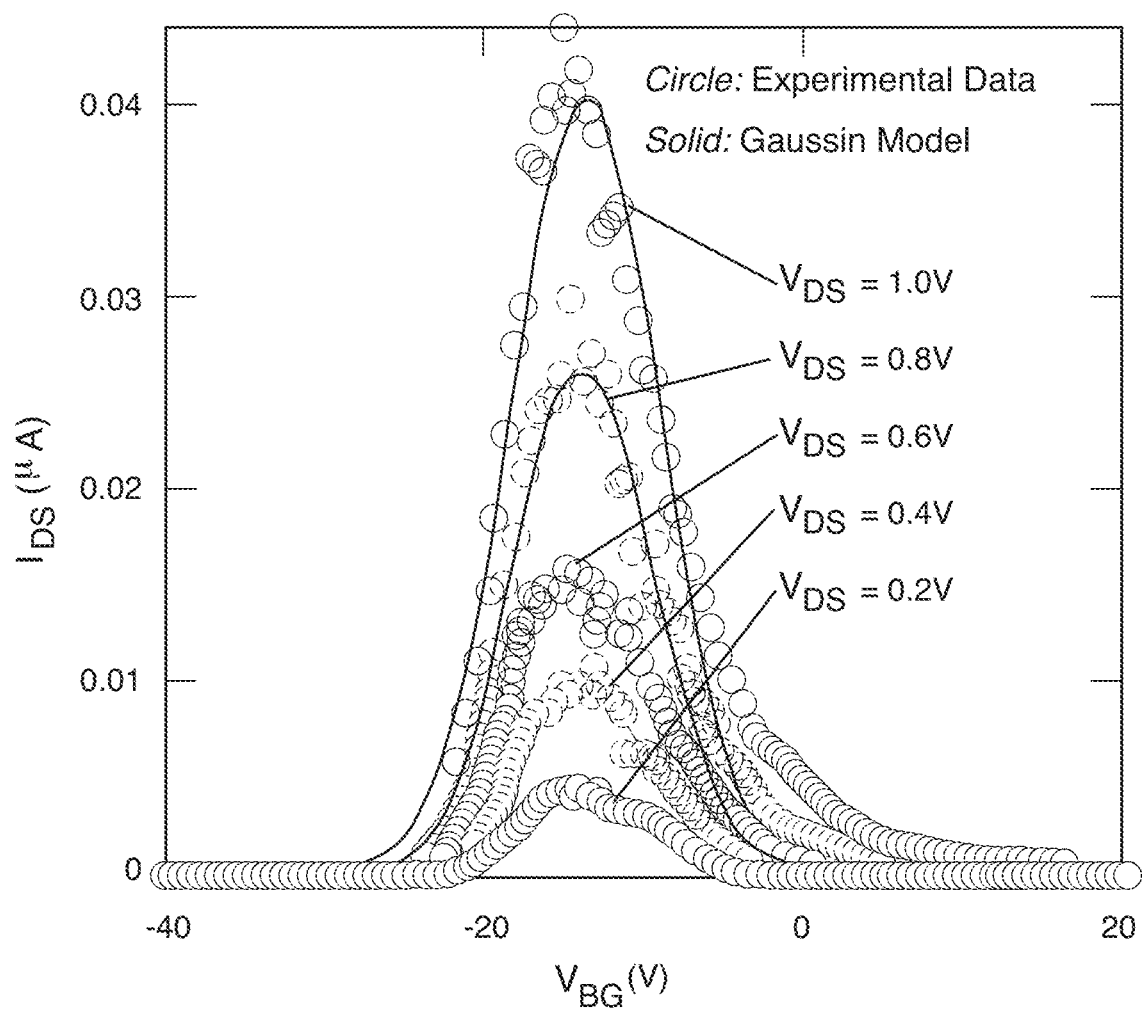
FIG. 2 shows experimentally measured transfer characteristics i.e. drain current ($I_{DS}$) versus back-gate voltage ($V_{BG}$) of an embodiment of the Gaussian synapse device for different drain voltages ($V_{DS}$), showing amplitude control.

FIG. 2 shows the experimentally measured transfer characteristics, i.e. the drain current (I$_{DS}$) versus back-gate voltage (V$_{BG}$) of the Gaussian synapse device 100 for different drain voltages (V$_{DS}$). Clearly, the transfer characteristics resemble a Gaussian distribution, which can be modeled using the following equation.

$$I_{DS} = \frac{A}{\sqrt{2\pi\sigma_V^2}} \exp\left[-\frac{(V_{BG} - \mu_V)^2}{2\sigma_V^2}\right]; A = \beta V_{DS}$$

Figure 3:
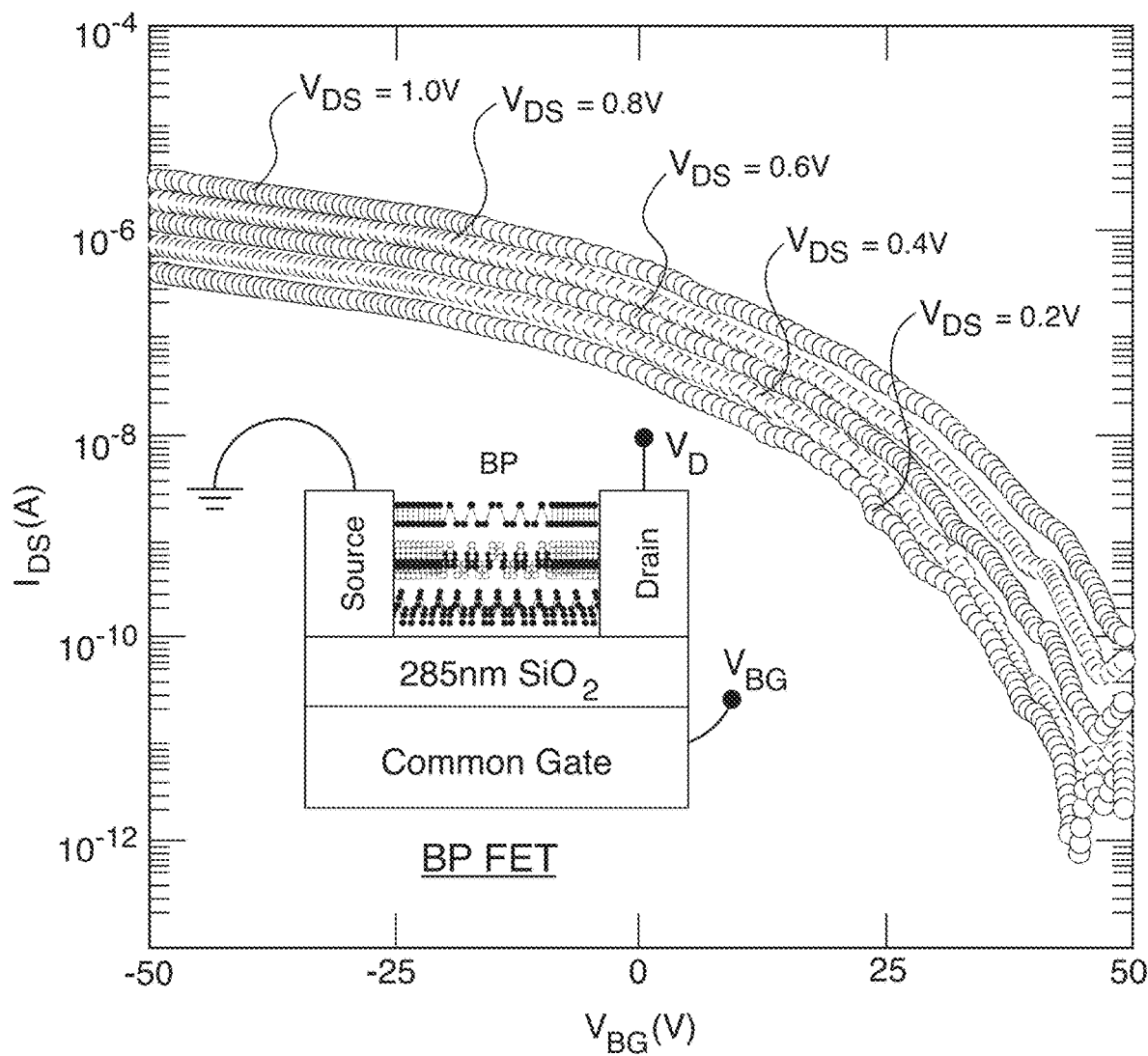
FIG. 3 shows transfer characteristics of a p-type BP FET.
Figure 4:
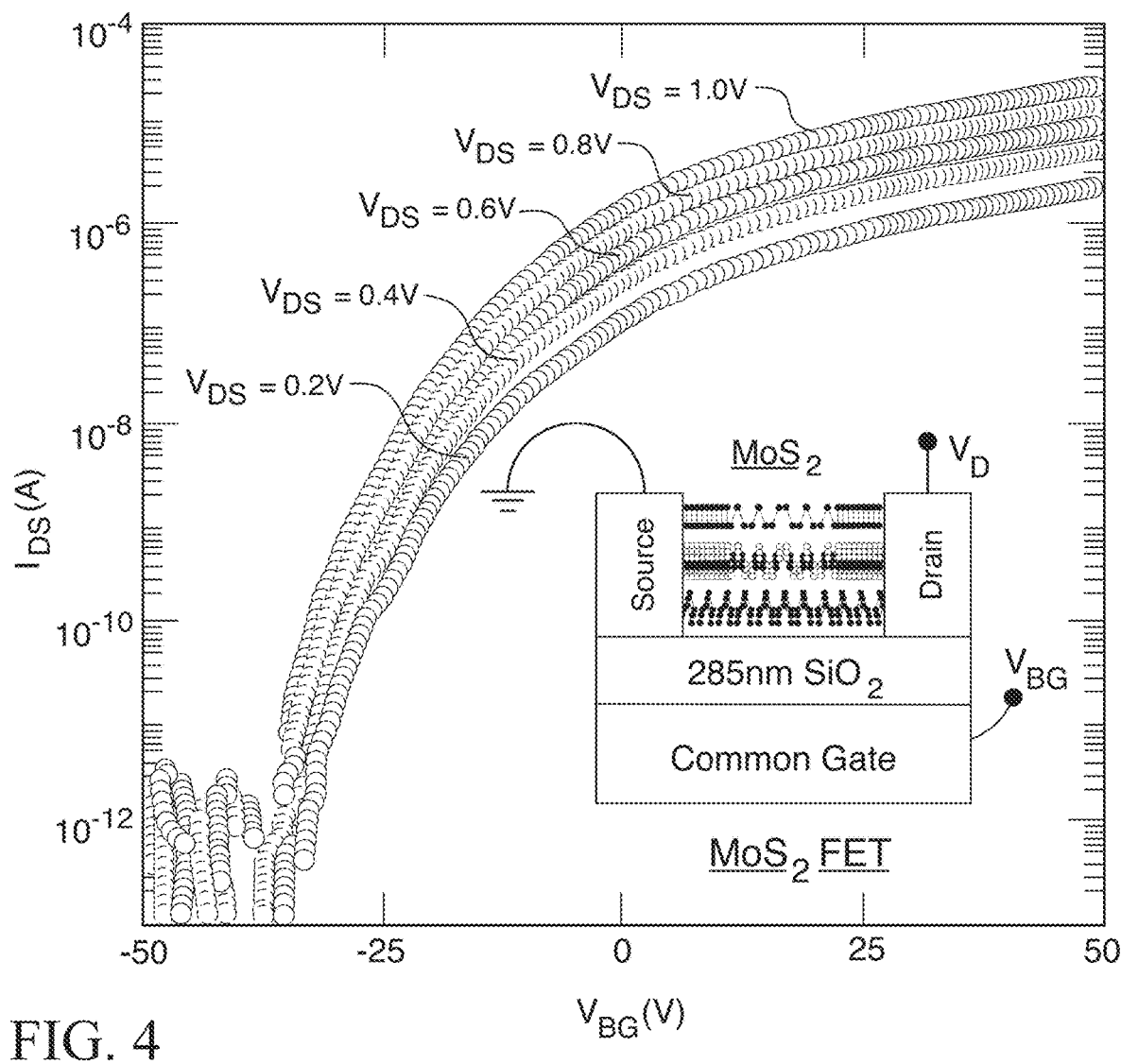
FIG. 4 shows transfer characteristics of an n-type $MoS_2$ FET.

A, μ$_V$, and σ$_V$ are, respectively, the amplitude, mean, and standard deviation of the Gaussian distribution. For a specific MoS$_2$/BP pair, μ$_V$ and σ$_V$ are found to be constants, whereas, A varies linearly with V$_{DS}$. The emergence of Gaussian transfer characteristics can be explained using the experimentally measured transfer characteristics of its constituents (constituents being the MoS$_2$ FET 116 and the BP FET 114), as shown in FIGS. 3 and 4, respectively. MoS$_2$ FETs 116 exhibit unipolar n-type characteristics, irrespective of the choice of contact metal, owing to the phenomenon of metal Fermi level pinning close to the conduction band that facilitates easier electron injection, whereas, BP FETs 114 are predominantly p-type with large work function contact metals, such as Ni for example. Furthermore, unlike conventional enhancement mode Si FETs used in Complementary Metal-Oxide-Semiconductor (CMOS) circuits, both MoS$_2$ FETS 116 and BP FETs 114 are depletion mode, i.e. they are normally ON without applying any back-gate voltage. Remarkably, this simple difference results in the unique Gaussian transfer characteristics for the MoS$_2$/BP pair in spite of the device structure closely resembling a CMOS logic inverter. From the equivalent circuit diagram, the current (I$_{DS}$) through the Gaussian synapse can be written as:

$$I_{DS} = \frac{V_{DS}}{R_{MoS_2} + R_{BP}}$$

For extreme V$_{BG}$ values (large negative (<−30V) and large positive (>30V)), the MoS$_2$ FET 116 and the BP FET 114 are in their respective OFF states, making the corresponding resistances (R$_{MoS2}$ and R$_{BP}$) very large (approximately TΩ). This prevents any current conduction between the source contact 110 and the drain contact 108 terminals of the Gaussian synapse device 100. However, as the MoS$_2$ FET 116 switches from OFF state to ON state, current conduction begins and increases exponentially with V$_{BG}$ following the subthreshold characteristics and reaches its peak magnitude determined by the V$_{DS}$. Beyond this peak, the current starts to decrease exponentially following the subthreshold characteristics of the BP FET 114. As a result, the series connection of the MoS$_2$ FET 116 and BP FET 114 exhibits non-monotonic transfer characteristics with exponential tails that mimics a Gaussian distribution.

The Gaussian synapse device 100 does not utilize the ON state FET performance, and is therefore minimally influenced by the carrier mobility values of the n-type FET 116 and p-type FET 114. Instead, the Gaussian synapse device 100 exploits the sub-threshold FET characteristics, where the slope is independent of the carrier mobility of the semiconducting channel material. Thus, for symmetric Gaussian synapses, it may be more desirable to ensure similar sub-threshold slope (SS) for the respective FETs than the carrier mobility. Ideally, SS values for both FETs should be 60 mV/decade. However, presence of a nonzero interface trap capacitance worsens the SS. The SS can be improved by minimizing interface states at the 2D/gate-dielectric interface as well as by scaling the thickness of the gate dielectric. It may also be desirable to have FETs with Ohmic contacts for the Gaussian synapse device 100 to ensure that the SS is determined by the thermionic emission of carriers in order to reach the minimum theoretical value of 60 mV/decade at room temperature. For Schottky contact FETs, the SS can be severely degraded due to tunneling of carriers through the Schottky barrier.

While embodiments of the Gaussian synapse device 100 is described using exfoliated MoS$_2$ and BP flakes, micro-mechanical exfoliation is generally not a scalable manufacturing process for large-scale integrated circuits. Therefore, hardware implementation of a probabilistic neural network (PNN) 124 using embodiments of the Gaussian synapse device 100 may require large-area growth of MoS$_2$ and BP. Wafer-scale growth of high quality MoS$_2$ and BP using chemical vapor deposition (CVD) and metal organic chemical vapor deposition (MOCVD) techniques may be used to achieve this. In addition, while embodiments are disclosed using two different 2D materials (e.g., MoS$_2$ and BP), owing to their superior performance as n-type and p-type FETs, respectively, there are 2D materials, such as WSe2 which offer ambipolar transport, i.e. the presence of both electron and hole conduction and can be grown over large area using CVD techniques. It should be noted, however, that the performance of WSe$_2$ based n-type and p-type FETs can be limited by the presence of large Schottky barriers at the metal/2D contact interfaces. By resolving the contact resistance related issues and improving the quality of large-area synthesized WSe$_2$, it is possible to implement Gaussian synapses based solely on WSe$_2$ as well. Use of WSe$_2$ is discussed in more detail later.

Embodiments of the Gaussian synapse device 100 is a low power device because it exploits the subthreshold characteristics of FET devices, and as such bypass the Boltzmann tyranny that necessitates a minimum switching voltage for the device to turn ON. In this context, the total power consumption (P$_{total}$) in digital CMOS circuit comprises, primarily, of dynamic switching power (P$_{dynamic}$) and static leakage power (P$_{static}$) and is given by the following equation:

$$P_{total}P_{dynamic} + P_{static} = \eta CV_{DD}^2 f + I_{static} V_{DD}$$

η is the activity factor, C is the capacitance of the circuit, f is the switching frequency, and V$_{DD}$ is the supply voltage. For CMOS devices before the year 2005, the power consumption of the chip was dominated by P$_{dynamic}$, which was kept constant by scaling the threshold voltage (V$_T$) and concurrently the supply voltage of the MOSFET. However, beyond 2005, the voltage scaling stalled since further reduction in $V_T$ resulted in an exponential increase in the static leakage current ($I_{static}$) and hence static power consumption. This is a direct consequence of the non-scalability of the subthreshold swing (SS) to below 60 mV/decade, as determined by the Boltzmann statistics. In fact, with state-of-the-art technology, $P_{total}$ is mostly dominated by $P_{static}$. Regardless of whether the dynamic or static power dominates, reinstating VD scaling is the only way to escape the Boltzmann tyranny. This is why in recent years, subthreshold logic circuits, which utilize $V_{DS}$ that is close to or even less than $V_T$, have received significant attention for ultralow power applications. New subthreshold logic and memory design methodologies have already been developed and demonstrated on a fast Fourier transform (FFT) processor, as well as analog VLSI neural systems.

Figure 5A:
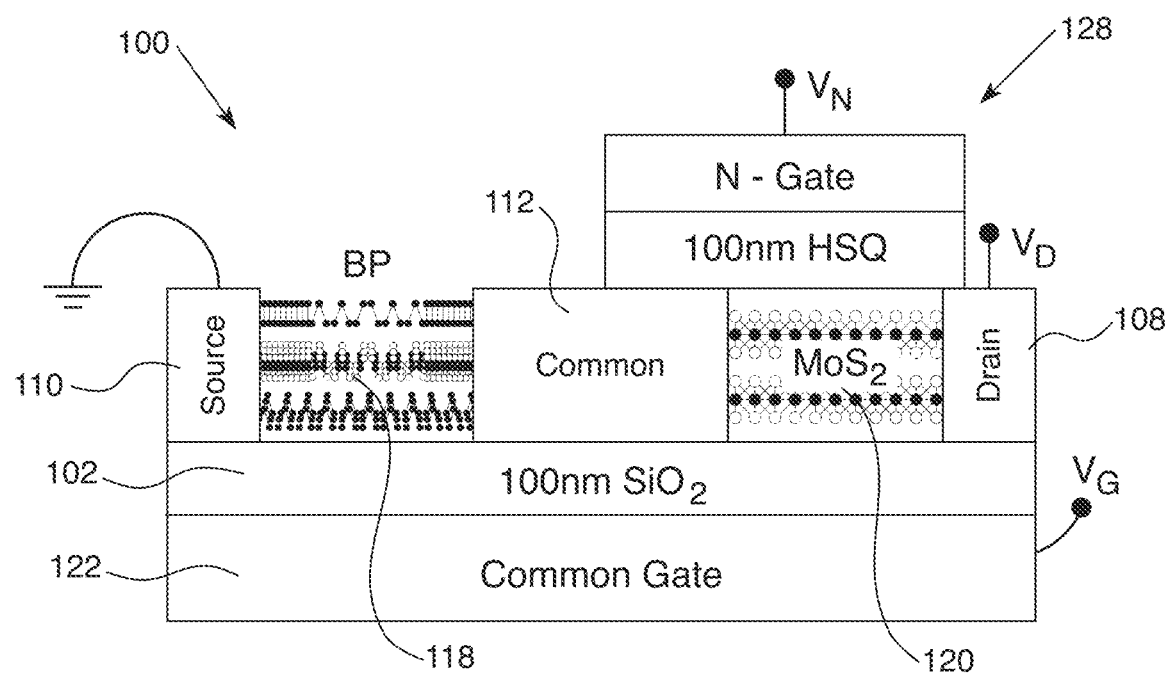
FIG. 5A shows the schematic representation of a reconfigurable Gaussian synapse device, where the $MoS_2$ FET is dual-gated.
Figure 5B:
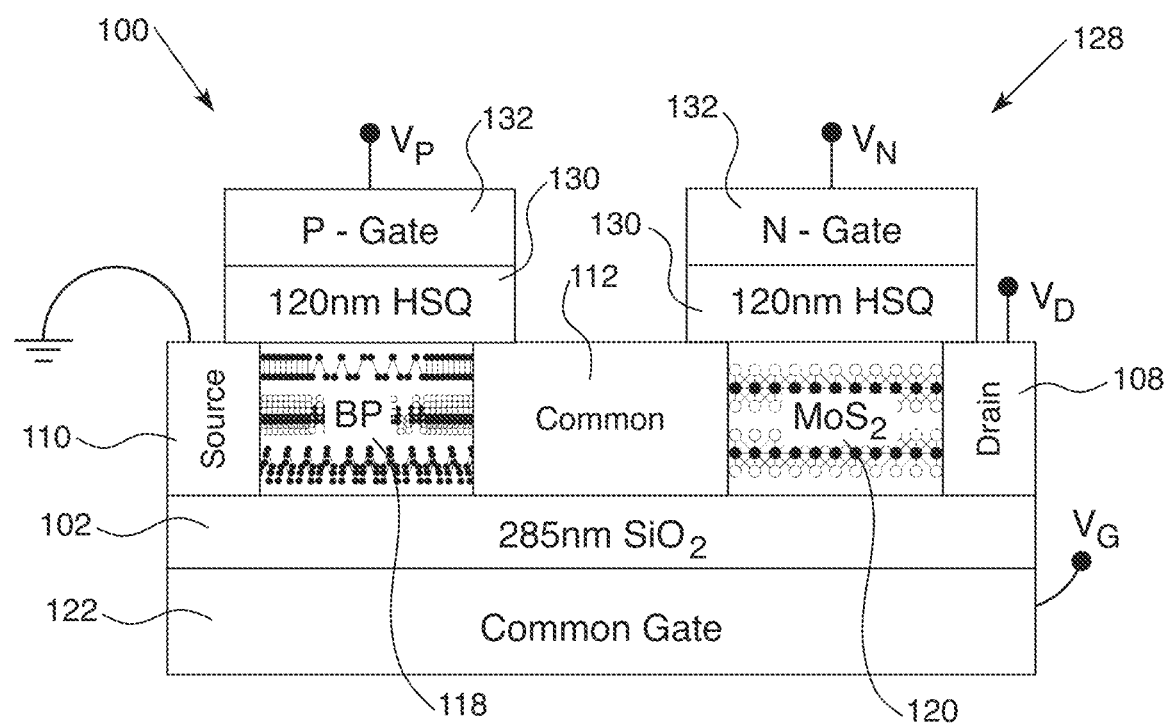
FIG. 5B shows the schematic representation of a reconfigurable Gaussian synapse device, where both the $MoS_2$ FET and the BP FET are dual-gated.

Referring to FIG. 5, for the hardware implementation of the Gaussian synapse device 100, it may be highly desirable to demonstrate complete tunability of the device transfer function (i.e., tenability of A, $\mu_V$, and $\sigma_V$ of the Gaussian distribution. This could be achieved, seamlessly, in the disclosed Gaussian synapse device 100 structure via threshold engineering. For instance, additional gating of either one or both of the n-type FET 116 or p-type FET 114 can be done to facilitate tunability (or reconfigurability). FIG. 5A shows the schematic representation of an exemplary reconfigurable Gaussian synapse device 100, where the MoS$_2$ FET 116 is dual-gated. It should be understood that a reconfigurable Gaussian synapse device 100 can similarly be formed by dual-gating the BP FET 114. FIG. 5B shows the schematic representation of a reconfigurable Gaussian synapse device 100, where both the MoS$_2$ FET 116 and the BP FET 114 are dual-gated. The top-gate stack can be fabricated using hydrogen silsesquioxane (HSQ) as a top-gate dielectric with nickel/gold (Ni/Au) as the top-gate electrode.

Thus, the Gaussian synapse device 100 can include a substrate 102 having an upper surface 104 and a lower surface 106. A drain contact 108 can be formed on a portion of the upper surface 104. A source contact 110 can be formed on a portion of the upper surface 104. A common contact 112 can be formed on a portion of the upper surface 104. The common contact 112 can be used as a common contact 112 that will form a first FET 114 between it and the source contact 110 and a second FET 116 between it and the drain contact 108. A first channel 118 is formed between the source contact 110 and the common contact 112. The first channel 118 can be a p-type channel, thereby forming a p-type FET 114 as the first FET 114. A second channel 120 is formed between the drain contact 108 and the common contact 112. The second channel 120 can be an n-type channel, thereby forming an n-type FET 116 as the second FET 116. A back-gate contact 122 is used to measure the back-gate characteristics. A first top-gate 126 can be formed on the source contact 110 and the common gate 112 (e.g., span the length of the first channel 118 and be in contact with the source contact 110 and the common gate 112), thereby forming a dual-gated p-type FET 114. For instance, the first top-gate 126 can be formed on the source contact 110, the first channel 118, and the common gate 112. A second top-gate 128 can be formed on the drain contact 108 and the common gate 112 (e.g., span the length of the second channel 120 and be in contact with the drain contact 108 and the common contact 112), thereby forming a dual-gated n-type FET 116. For instance, the second top-gate 128 can be formed on the drain contact 108, the second channel 120, and the common contact 112. Any one or combination of the first top-gate 126 and the second top-gate 128 can be a top-gate stack fabricated using a top-gate dielectric 130 (e.g., hydrogen silsesquioxane (HSQ)) with a top-gate electrode 132 (e.g., nickel/gold (Ni/Au)).

The Gaussian synapse device 100 naturally requires operation in subthreshold regime in order to exploit the exponential feature in the transfer characteristics of the n-type FET 116 and the p-type FET 114. Furthermore, as shown in FIG. 2, the Gaussian synapse device 100 maintains its characteristic features even when the supply voltage ($V_{DS}$) is scaled down to 200 mV or beyond. This allows the Gaussian synapse device 100 to be inherently low power. For a proof-of-concept demonstration of an embodiment of the Gaussian synapse device 100, thicker back-gate 122 and top-gate 126 oxides were used with respective thicknesses of 285 nm and 120 nm. This necessitates the use of rather large back-gate and top-gate voltages in the range of −50 V to 50V and −35 V to 35 V, respectively. The power consumption by the proof-of-concept Gaussian synapse device 100 will still be high in spite of scaling the supply voltage and exploiting the subthreshold current conduction in the range of nano amperes through the MoS$_2$ FET 116 and the BP FET 114. This is because power consumption by Gaussian synapse device 100 is simply the area under the IDS versus $V_{BG}$ curve. By scaling the thicknesses of both the top and bottom gate dielectrics, it is possible to scale the operating gate voltages, and thereby achieve desirable power benefits from the Gaussian synapse device 100. Ultra-thin dielectric materials such as Al$_2$O$_3$ and HfO$_2$, which offer much larger dielectric constants ($\varepsilon$o~9 and ~25 respectively can be used as gate oxides. It should also be emphasized that the use of atomically thin 2D materials can allow for geometric miniaturization of the Gaussian synapse device 100 without any loss of electrostatic integrity, which aids size scaling. Generally, the scalability of an FET is captured through a simple parameter called the screening length:

$$\left(\lambda_{SC} = \sqrt{\frac{\varepsilon_{body}}{\varepsilon_{ox}} t_{body} t_{ox}}\right).$$

This determines the decay of the potential (band bending) at the source/drain contact interface into the semiconducting channel. In this expression, $t_{body}$ and $t_{ox}$ are the thicknesses and $E_{body}$ and $E_{ox}$ are the dielectric constants of the semiconducting channel and the insulating oxide, respectively. To avoid short channel effects, the channel length ($L_{CH}$) of an FET has to be at least three times higher than the screening length, i.e. $L_{CH} > 3\lambda_{SC}$. For atomically thin semiconducting monolayers of 2D materials, $t_{body} \approx 0.6$ nm, which corresponds to $\lambda_{SC} \approx 1.3$ nm, whereas for the most advanced FinFET technology, the thickness of Si fins can be scaled down to only 5 nm without severely increasing the bandgap due to quantum confinement effects and reducing the mobility due to enhanced surface roughness scattering. Nevertheless, the above discussions clearly articulate how a BP/MoS$_2$ 2D heterostructure based Gaussian synapse device 100 can facilitate effortless hardware realization of PNNs 124 and thereby aid complexity scaling without compromising energy and size scaling.

Figure 6:
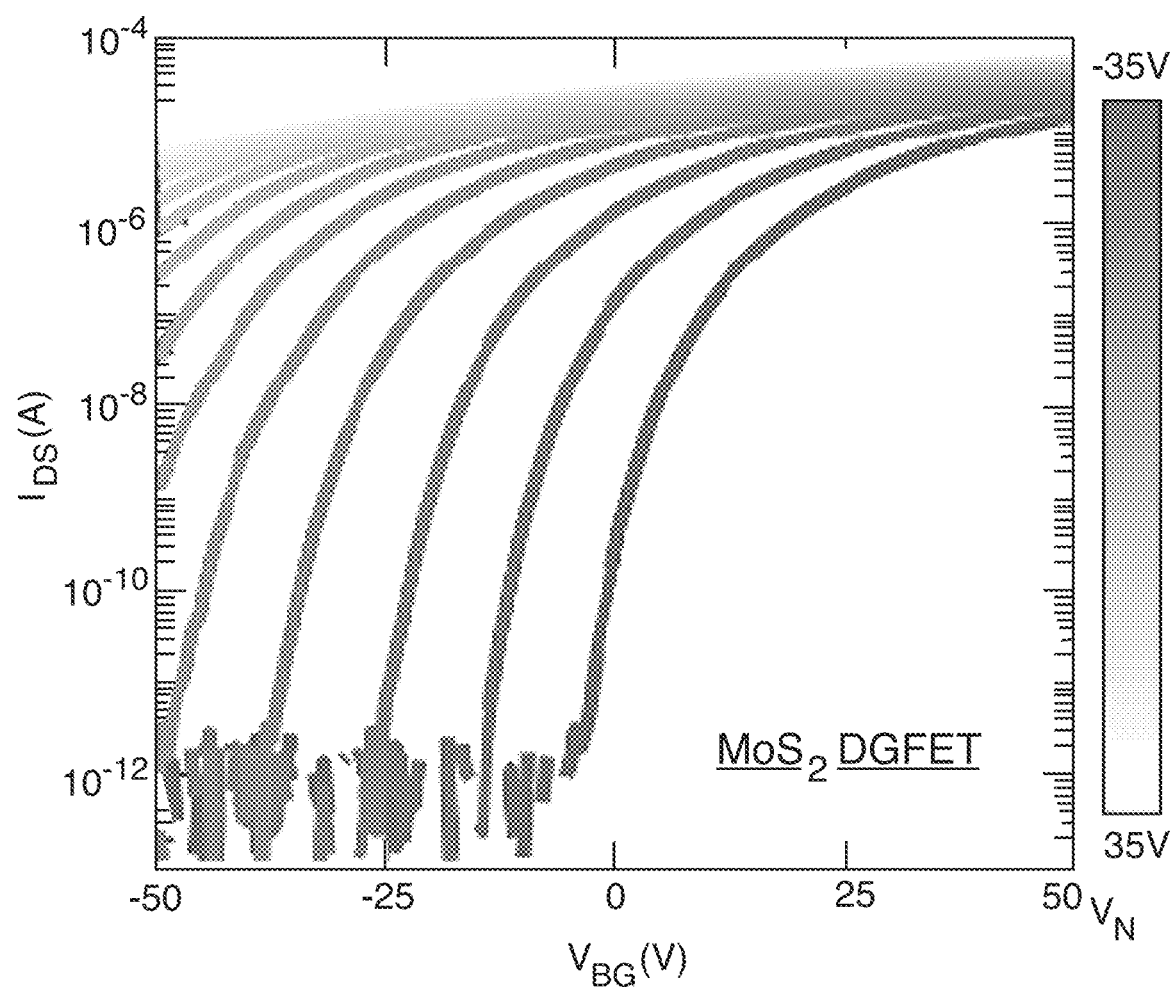
FIG. 6 shows the experimentally measured back-gated transfer characteristics of the $MoS_2$ FET at $V_{DS}=1V$ for different top-gate voltages ($V_N$) for the Gaussian synapse device of FIG. 5B.
Figure 7:
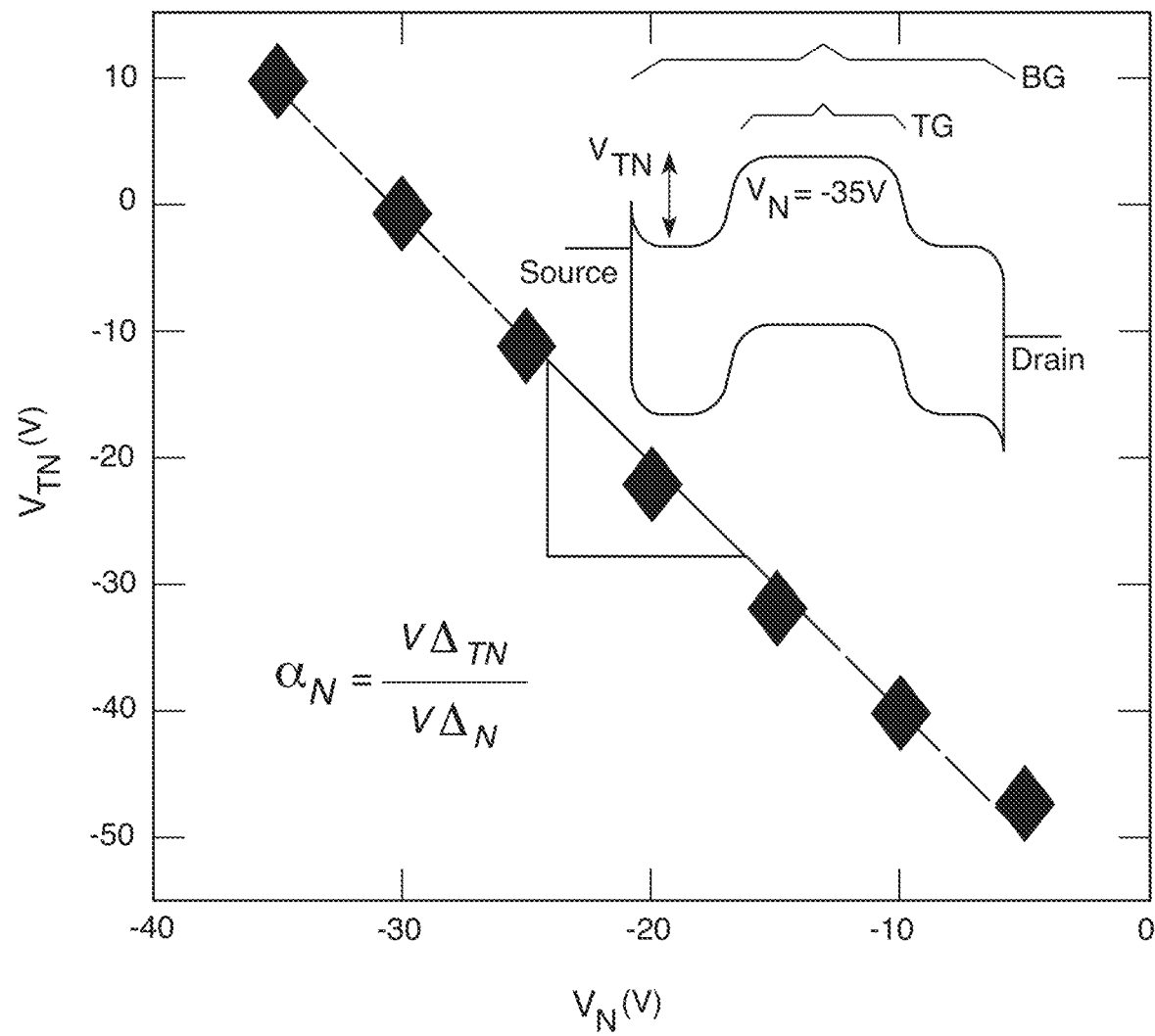
FIG. 7 shows the back-gate threshold voltage versus $V_N$ of $MoS_2$ FET.

FIG. 6 shows the experimentally measured back-gated transfer characteristics of the MoS$_2$ FET 116 at $V_{DS}=1$V for different top-gate voltages ($V_N$) for the Gaussian synapse device 100 of FIG. 5B. Clearly, $V_N$ controls the back-gate threshold voltage ($V_{TN}$) of the MoS$_2$ FET 116 as shown in FIG. 7. The energy band diagram shown in the inset of FIG. 7 can be used to explain the concept of threshold voltage engineering using gate electrostatics. The top-gate voltage determines the height of the potential barrier for electron injection inside the MoS$_2$ channel 120, which must be overcome by applying back-gate voltage to enable current conduction from the common contact 112 (which acts as the source for MoS$_2$ FET 116) terminal to the drain contact 108 terminal. Negative top-gate voltages increase the potential barrier for electron injection and hence necessitate larger positive back-gate voltages to achieve similar level of current conduction. As such, V$_{TN}$ becomes more positive (less negative) for large negative V$_N$ values. Note that the slope ($\alpha_N$) of V$_{TN}$ versus V$_N$ in FIG. 7 must be proportional to the ratio of top-gate capacitance (C$_{TG}$) to the back-gate capacitance (C$_{BG}$). This follows directly from the principle of charge balance, which ensures that the channel charge induced by the top-gate voltage must be compensated by the back-gate voltage at threshold.

The value for $\alpha_N$ is ~1.91. This is consistent with the theoretical prediction of ~1.94, given that the top-gate and back-gate dielectric thicknesses are 120 nm and 285 respectively and the top-gate insulator, HSQ, has a slightly lower dielectric constant (~3.2) than the back-gate insulator, SiO$_2$ (3.9).

Figure 8:
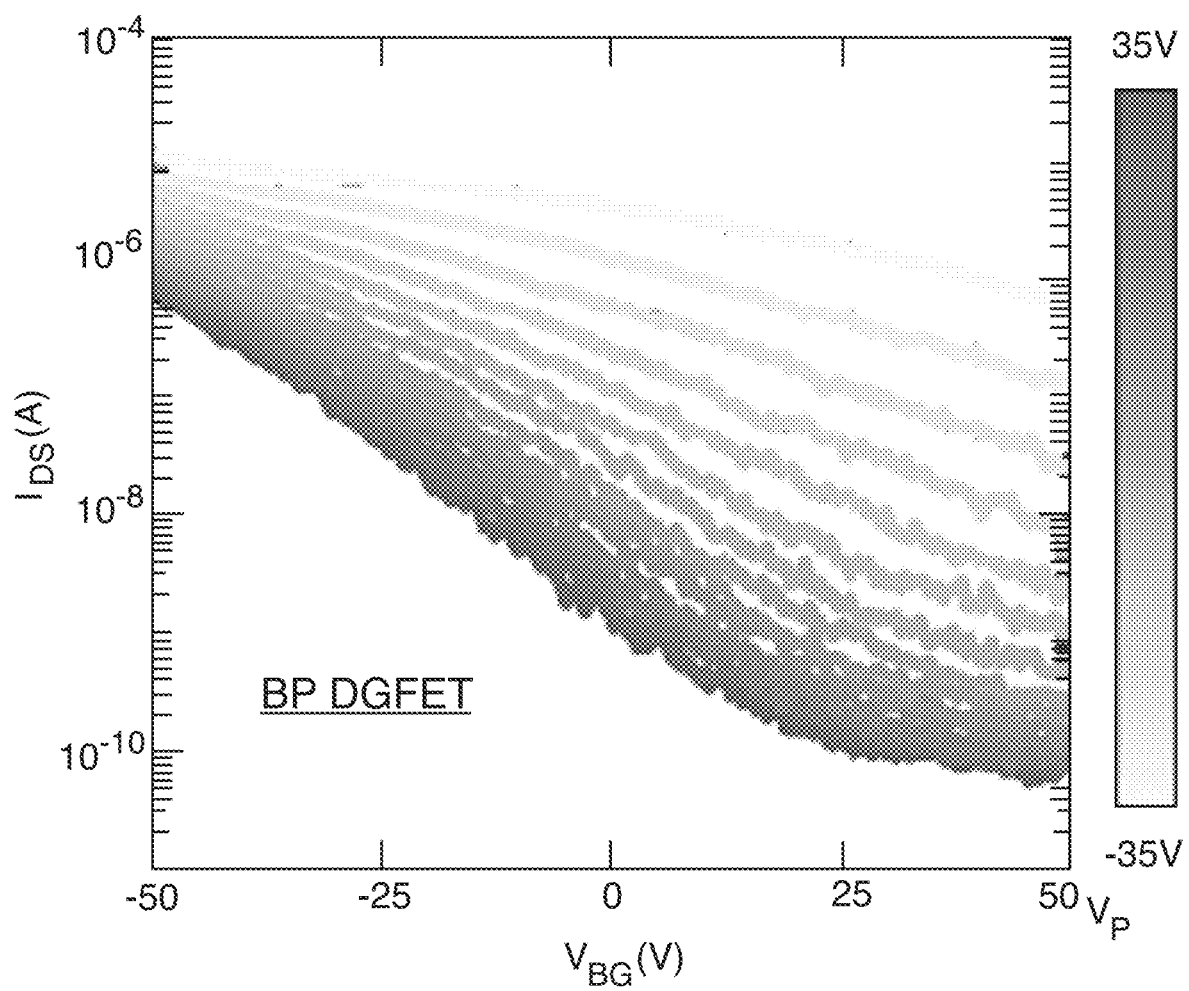
FIG. 8 shows the experimentally measured back-gated transfer characteristics of the BP FET at $V_{DS}=1V$, for different top-gate voltages ($V_P$) for the Gaussian synapse device of FIG. 5B.
Figure 9:
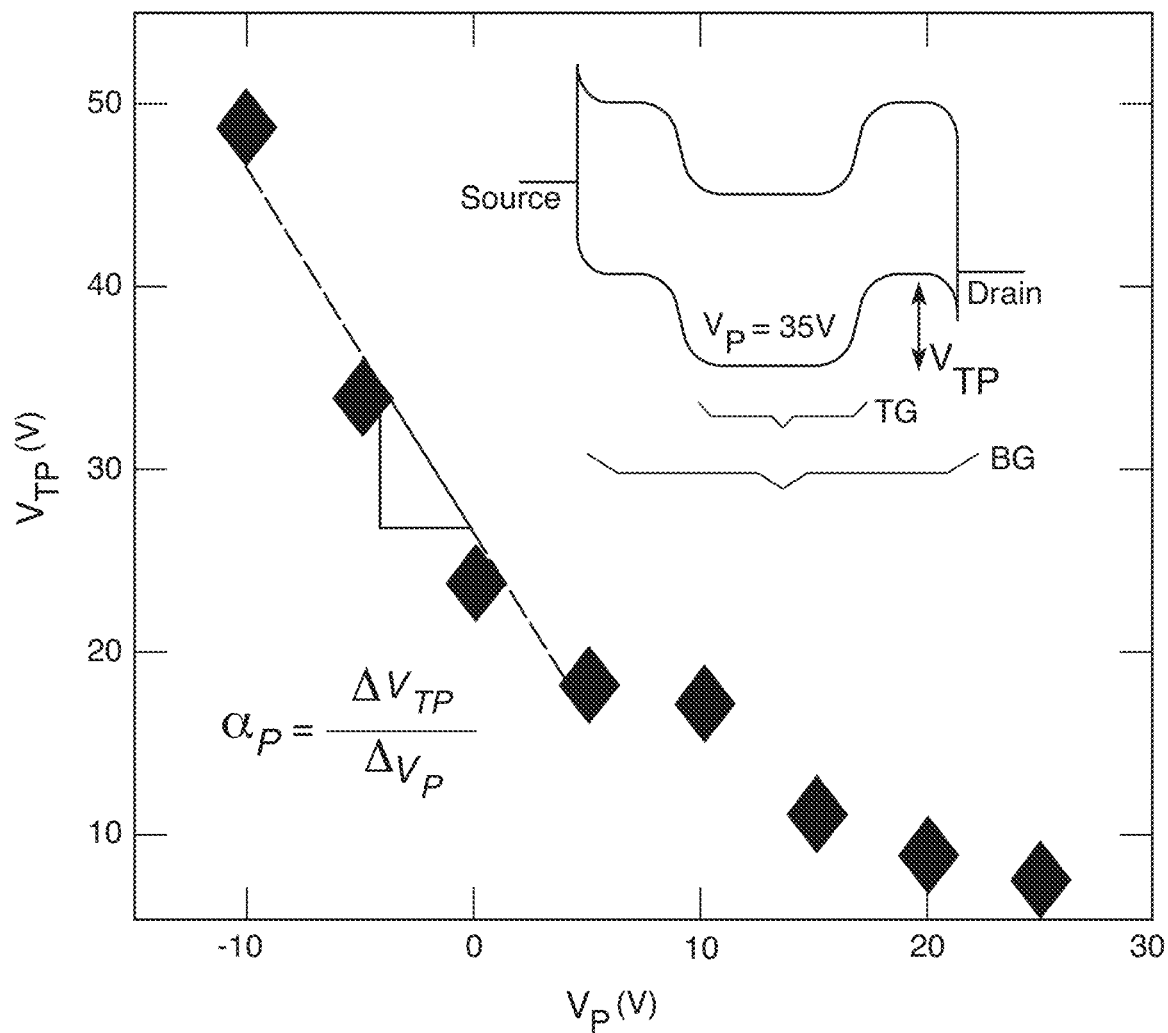
FIG. 9 shows the back-gate threshold voltage versus $V_P$ of the BP FET.

FIG. 8 shows the experimentally measured back-gated transfer characteristics of the BP FET 114 at V$_{DS}$=1V, for different top-gate voltages (V$_P$). As expected, V$_P$ controls the back-gate threshold voltage (V$_{TP}$) of the BP FET 114, as shown in FIG. 9. A similar explanation follows except for the fact that the top-gate voltage in case of the BP FET 114 influences the height of the potential barrier for hole injection, which is overcome by applying a back-gate voltage, enabling current conduction from the common contact 112 (which acts as the drain for BP FET 114) terminal to the source contact 110 terminal. The corresponding energy band diagram is shown in the inset of FIG. 9. Positive top-gate voltages increase the potential barrier for hole injection and hence necessitate larger negative back-gate voltages to achieve similar level of current conduction. As such, V$_{TP}$ becomes more negative (less positive) for large positive V$_P$ values. The slope ($\alpha_P$) of V$_{TP}$ versus V$_P$ is shown in FIG. 9, which, as expected, is found to be ~2.

Figure 10:
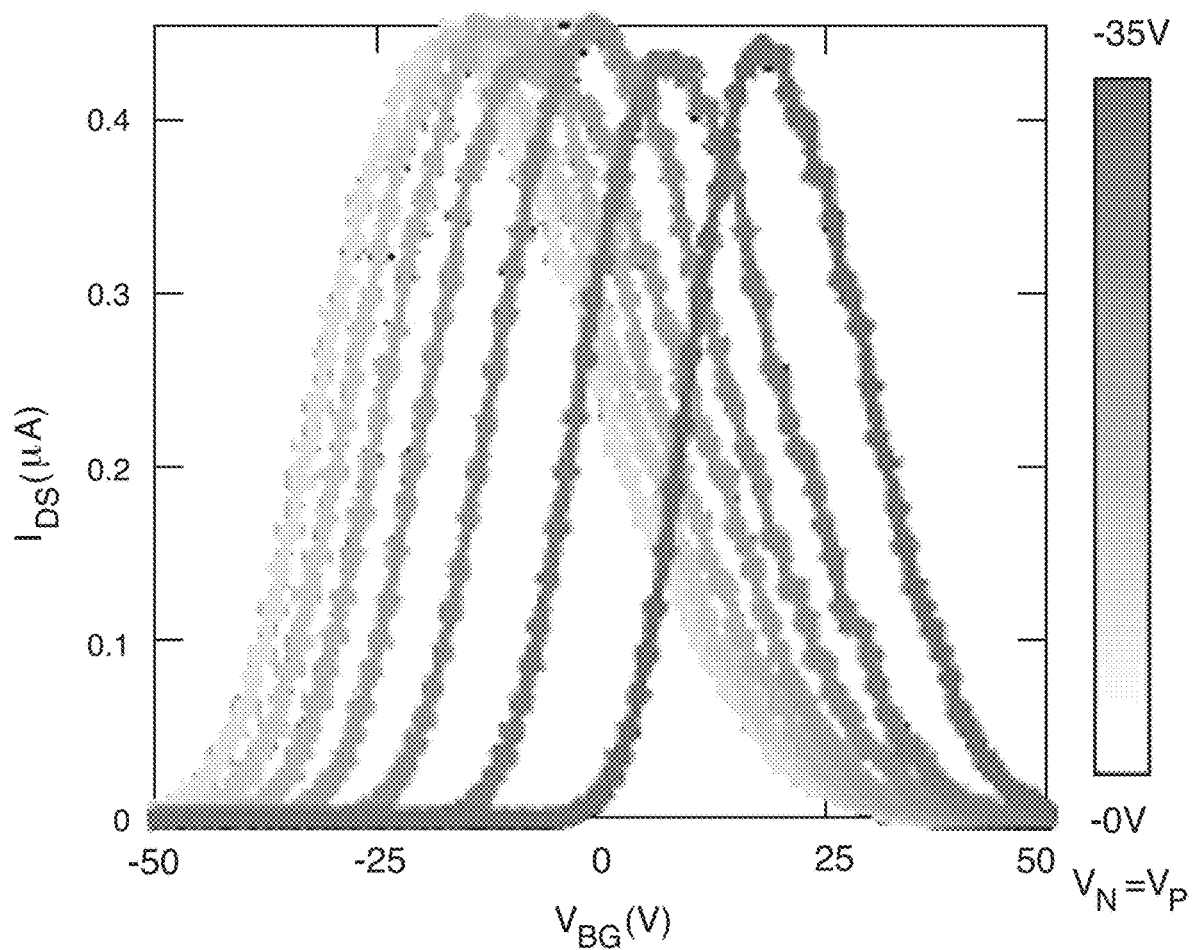
FIG. 10 shows the experimentally measured transfer characteristics of the Gaussian synapse for different values of $V_N=V_P$, with changing mean ($\mu_V$) of the Gaussian synapse.
Figure 11:
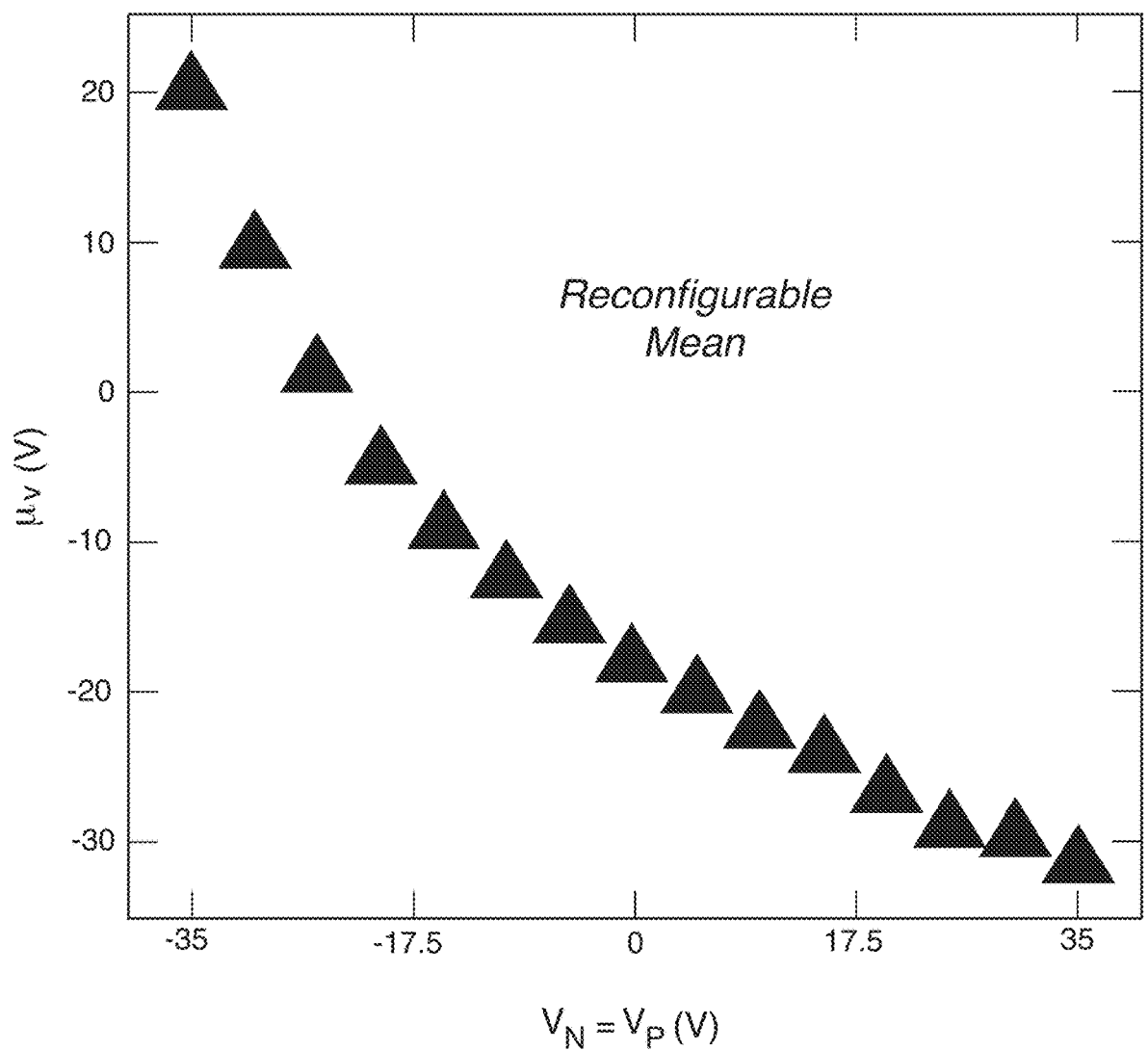
FIG. 11 shows $\mu_V$ plotted as a function of $V_N=V_P$ for an embodiment of a Gaussian synapse device.
Figure 12:
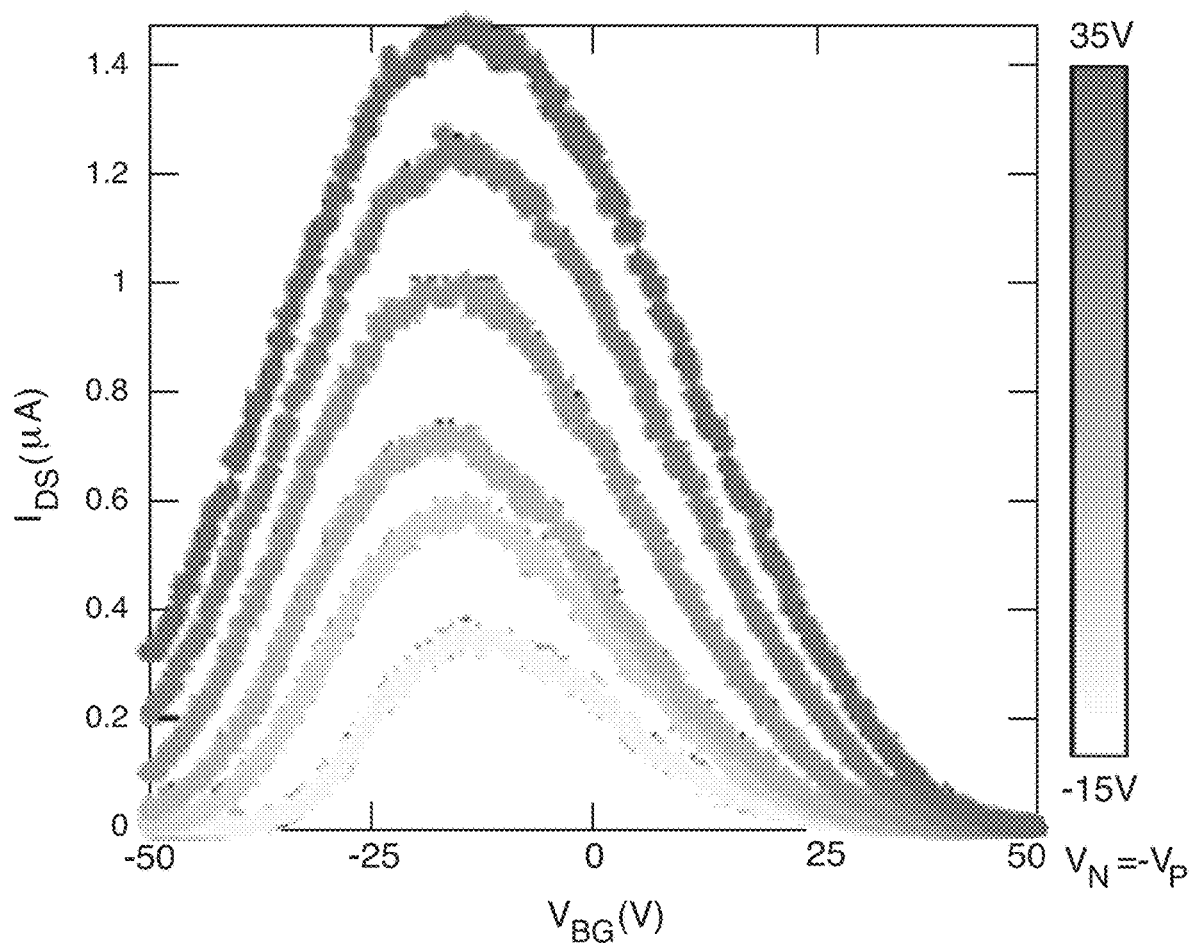
FIG. 12 shows the experimentally measured transfer characteristics of an embodiment of a Gaussian synapse device for different values of $V_N=-V_P$, with changing standard deviation ($\sigma v$) of the Gaussian synapse.
Figure 13:
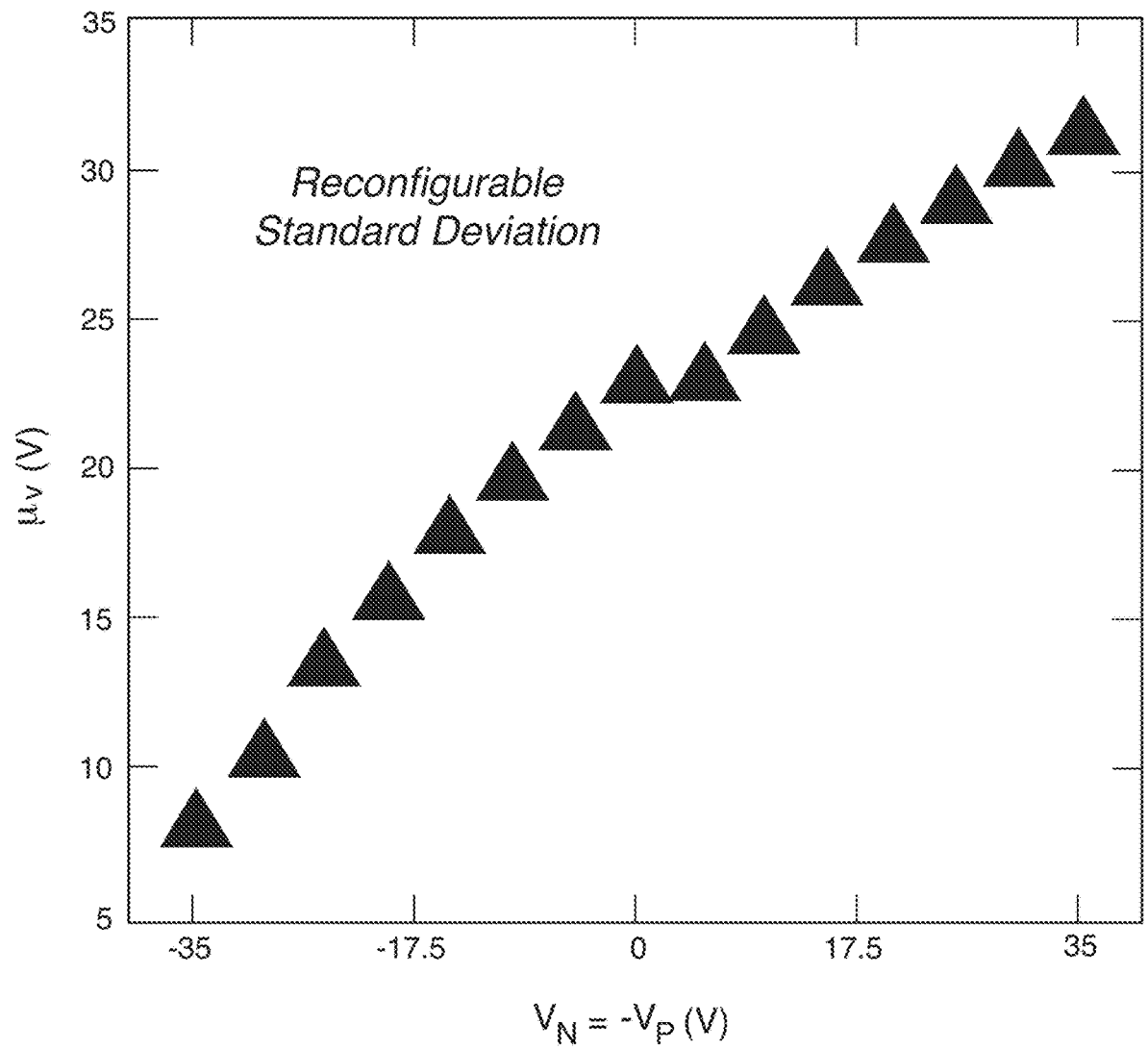
FIG. 13 shows $\sigma_V$ plotted as a function of $V_N=-V_P$ for an embodiment of a Gaussian synapse device.

The dual-gated MoS$_2$ and BP FETs 116, 114 allow complete control of the shape of the Gaussian synapse. FIG. 10 shows the experimentally measured transfer characteristics of an embodiment of the Gaussian synapse device 100 for different values of V$_N$=V$_P$. This configuration allows for a shift of the mean ($\mu_v$) of the Gaussian synapse without changing the amplitude (A) or the standard deviation ($\sigma_v$). FIG. 11 shows $\mu_V$ plotted as a function of V$_N$=V$_P$. This is achievable because the back-gate threshold voltages for both the MoS2 FET 116 and the BP FET 114 shift in the same direction in this configuration. Similarly, FIG. 12 shows the experimentally measured transfer characteristics of the Gaussian synapse for different values of V$_N$=−V$_P$. Under this configuration, the back-gate threshold voltages for the MoS$_2$ FET 116 and the BP FET 114 shift in opposite directions. As such the $\mu_V$ of the Gaussian distribution remains constant, whereas, $\sigma_V$ keeps increasing. FIG. 13 shows $\sigma_V$ plotted as a function of V$_N$=−V$_P$. However, this configuration also results in an increase in the amplitude (A) of the Gaussian synapse as av increases. This increase can be adjusted by changing the drain voltage (V$_{DS}$) since A is linearly proportional to V$_{DS}$. Nevertheless, by controlling V$_N$, V$_P$, and V$_D$, it is possible to adjust the mean, standard deviation, and amplitude of the Gaussian synapse.

In order to project the performance of a scaled Gaussian synapse, a Virtual Source (VS) model for short channel Si MOSFETs was used. The Gaussian transfer characteristics (I$_D$ versus V$_G$ for different V$_D$) were simulated using the following equation.

$$I_D = \frac{V_D}{R_N + R_P}; R_N = \frac{L_N}{W_N}\frac{1}{\mu_N Q_N}; R_P = \frac{L_P}{W_P}\frac{1}{\mu_P Q_P};$$

$$Q_N = C_{BG}m\frac{k_B T}{q}\log\left[1 + \exp\left(\frac{V_G - V_{TN}}{mk_B T/q}\right)\right];$$

$$Q_P = C_{BG}m\frac{k_B T}{q}\log\left[1 + \exp\left(-\frac{V_G - V_{TP}}{mk_B T/q}\right)\right];$$

$$V_{TN} = \alpha V_N; V_{TP} = \alpha V_P; \alpha = C_{TG}/C_{BG};$$

In the VS model, both the subthreshold and the above threshold behavior is captured through a single semi-empirical and phenomenological relationship that describes the transition in channel charge density from weak to strong inversion.

R$_N$ and R$_P$ are the resistances, L$_N$ and L$_P$ are the lengths, W$_N$ and W$_P$ the widths, $\mu_N$ and $\mu_P$ are the carrier mobility values, and Q$_N$ and Q$_P$ are the inversion charges corresponding to the n-type and the p-type 2D-FETs, respectively. The band movement factor m is assumed to be unity for a fully depleted and ultra-thin body 2D-FET with negligible interface trap capacitance. V$_{TN}$ and V$_{TP}$ are the threshold voltages of the n-type and p-type 2D FETs determined by their respective top-gate voltages V$_N$ and V$_P$. Note, that in the subthreshold regime, the inversion charges (i.e., Q$_N$ and Q$_P$) increase exponentially with V$_G$, whereas above threshold the inversion charge is a linear function of V$_G$, which is seamlessly captured through the VS model.

Figure 14:
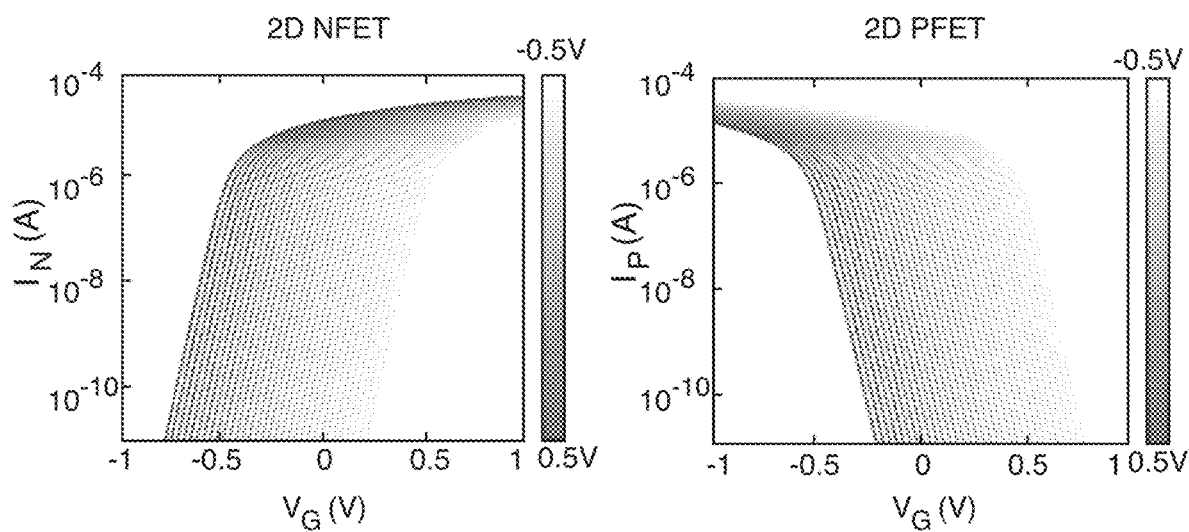
FIG. 14 shows simulated transfer characteristics using virtual source model of individual n-type and p-type 2D FETs.
Figure 15:
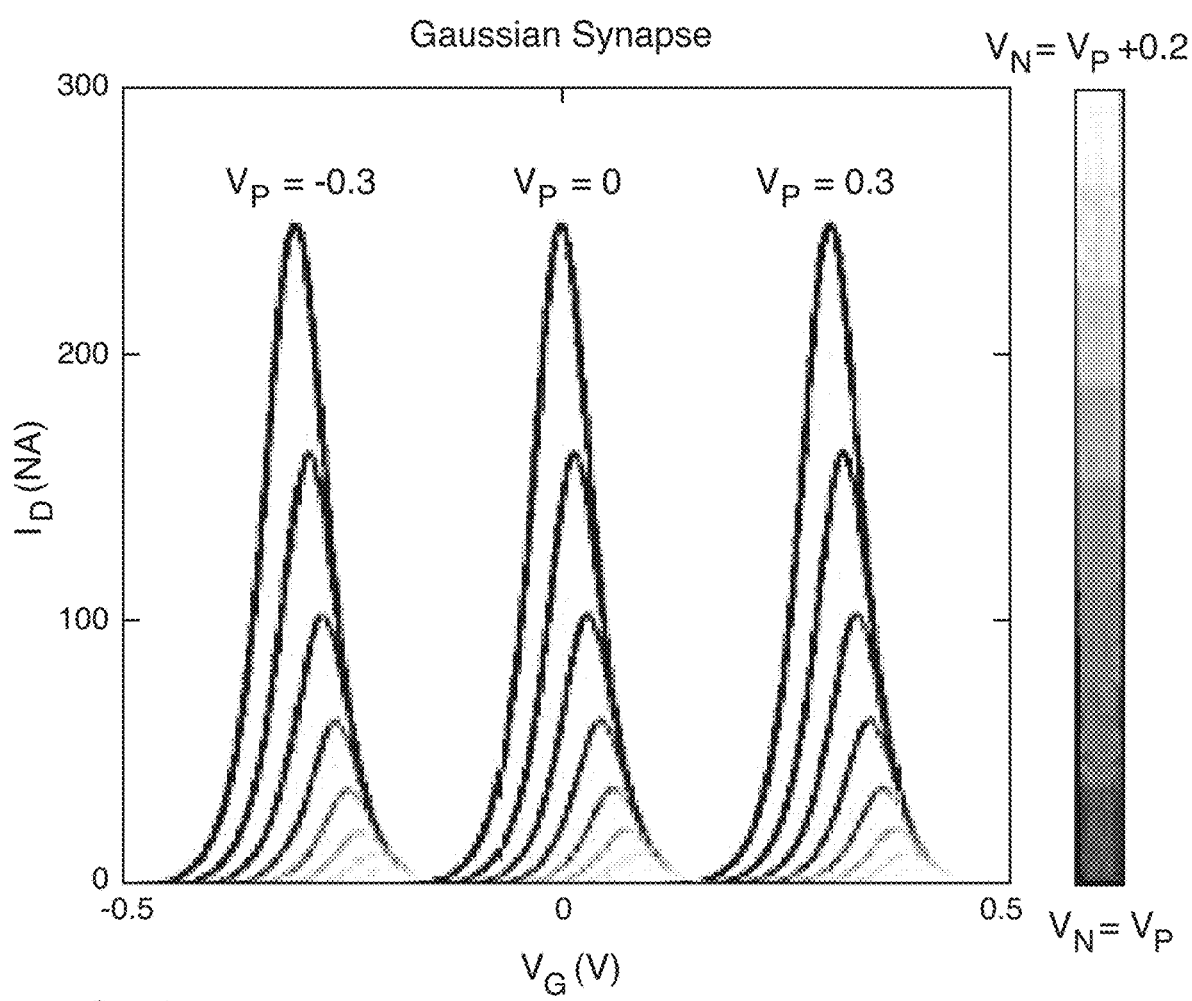
FIG. 15 shows the transfer characteristics of a Gaussian synapse based on its heterostructure for different combinations of the top-gate voltages.
Figure 16:
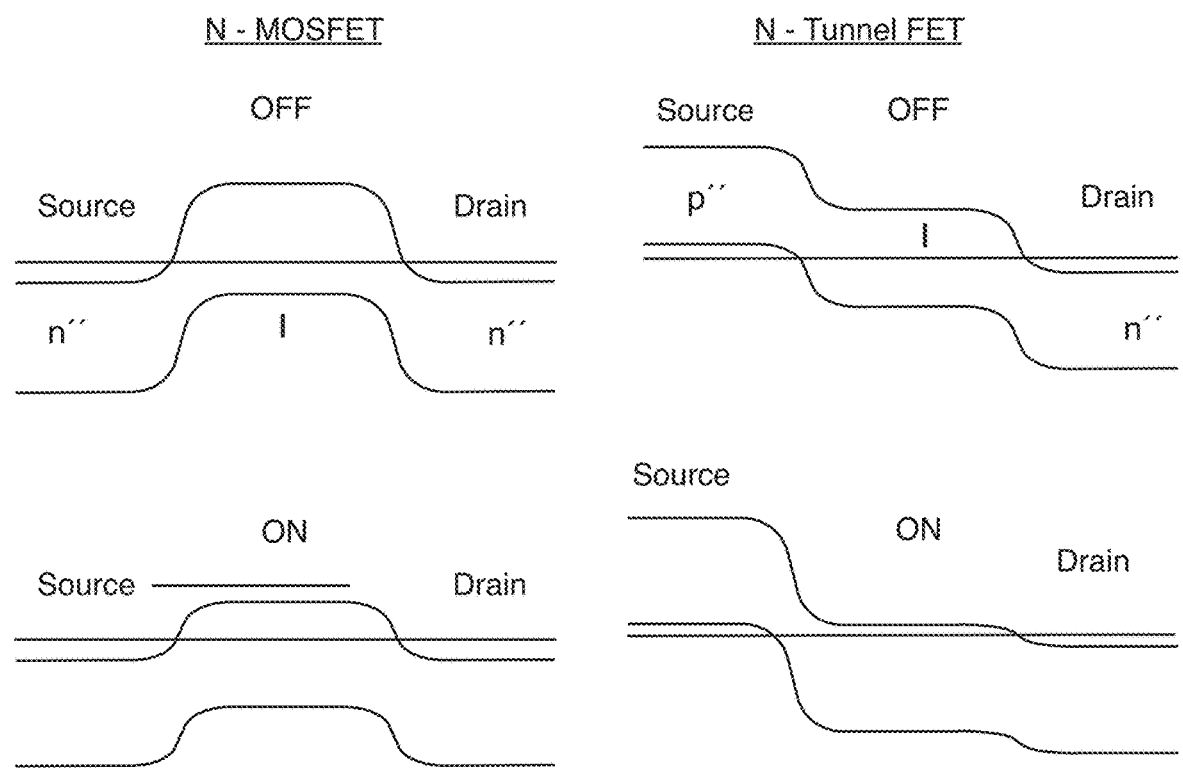
FIG. 16 shows energy band diagrams for an n-type FET and an n-type TFET in the ON and OFF state.

FIG. 14 shows the simulated transfer characteristics of the individual n-type and p-type 2D FETs. FIG. 15 shows the transfer characteristics of the Gaussian synapse based on its heterostructure for different combinations of the top-gate voltages, following the VS model, as described above. FIG. 16 demonstrates the tunability of A, $\mu_V$, and $\mu_V$ of the Gaussian synapse via top-gate voltages V$_N$ and V$_P$.

Figure 17:
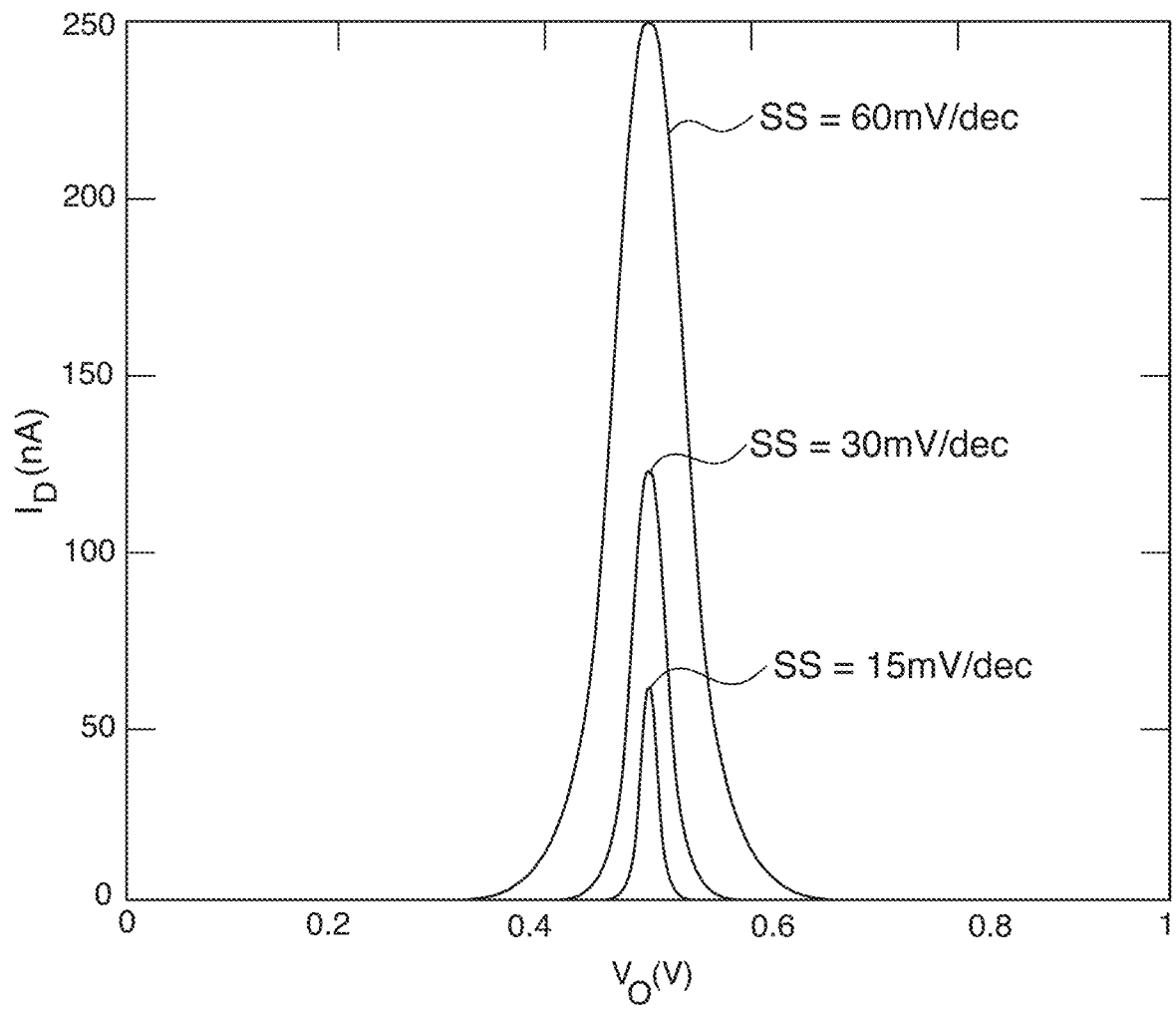
FIG. 17 shows the simulated transfer characteristics of a Gaussian synapse device using TFETs with different sub-threshold slope (SS) values.
Figure 18:
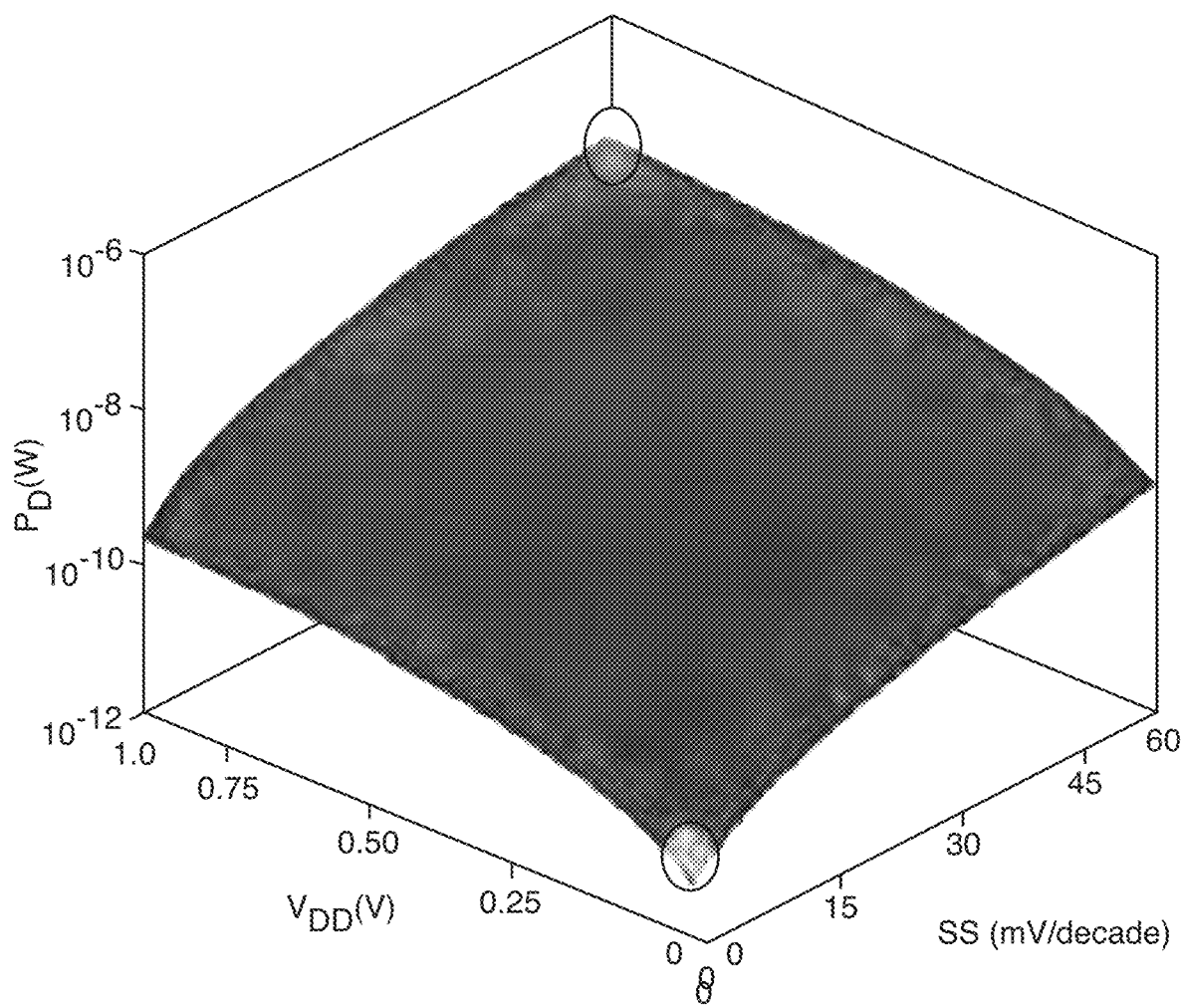
FIG. 18 shows the power dissipation as a function of $V_{DD}$ and SS scaling.

It is understood that power dissipation in the Gaussian synapse devices 100 may still be limited by the non-scalability of SS that determines the variance of the Gaussian distribution. It should be noted that total power dissipation is the area under the Gaussian current versus voltage characteristics. Therefore, it may be beneficial to replace the n-type FET 116 and the p-type FET 114 in the Gaussian synapse device 100 with corresponding tunnel field effect transistors (TFETs) in order to enhance the power benefits of the Gaussian synapse device 100. Energy band diagrams for an n-type FET and an n-type TFET are shown in FIG. 16. Unlike the FET, which switches by modulating the thermionic emission over a potential barrier, the TFET switches by modulating the quantum mechanical tunneling through a barrier and as such is not limited by the thermal Maxwell-Boltzmann tail of carriers, which limits the SS to 60 mV/decade. As such TFETs can beat the Boltzmann tyranny and achieve steep sub-60 mV/decade SS. Performance of the TFET is determined by the tunneling probability, which can be significantly improved by scaling the thickness of the semiconducting channel in the context of the TFETs. FIG. 17 shows the transfer characteristics of a Gaussian synapse device 100 using the TFETs with different SS values. FIG. 18 shows the power dissipation as a function of V$_{DD}$ and SS scaling. Clearly, Gaussian synapse devices 100 based on TFETS can offer several orders of magnitude power benefits.

Figure 19:
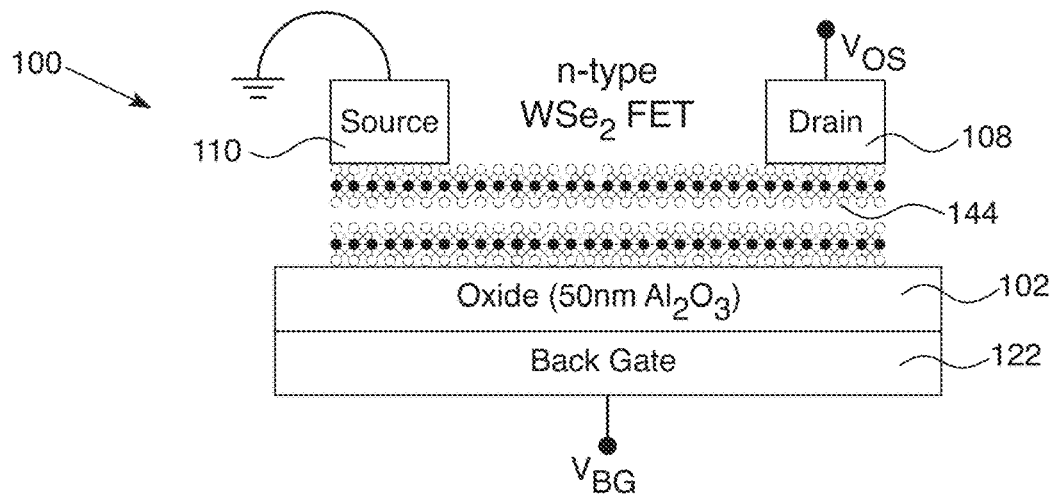
FIG. 19 shows a schematic of an embodiment of an n-type $WSe_2$ FET, along with the transfer and output characteristics of the $WSe_2$ FET.
Figure 19:
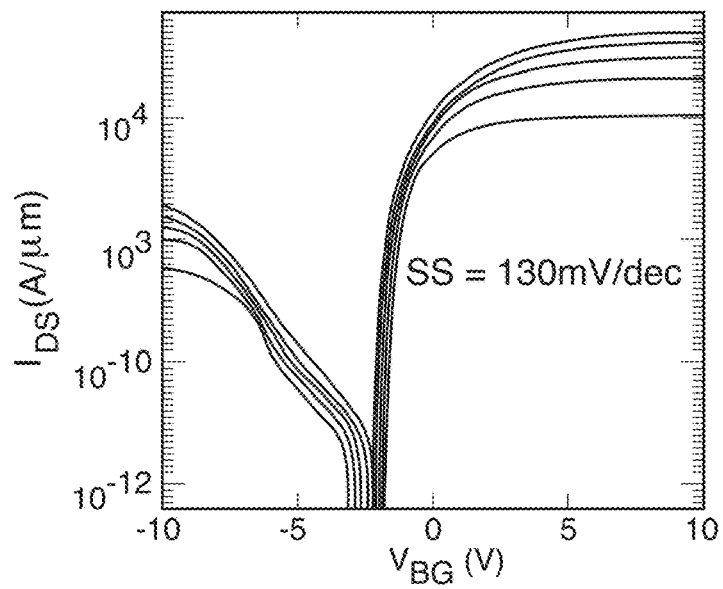
Figure 19:
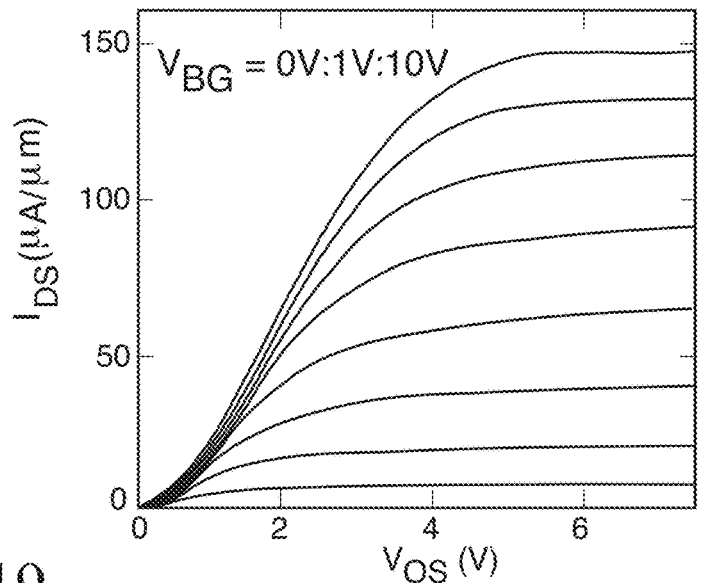
Figure 20:
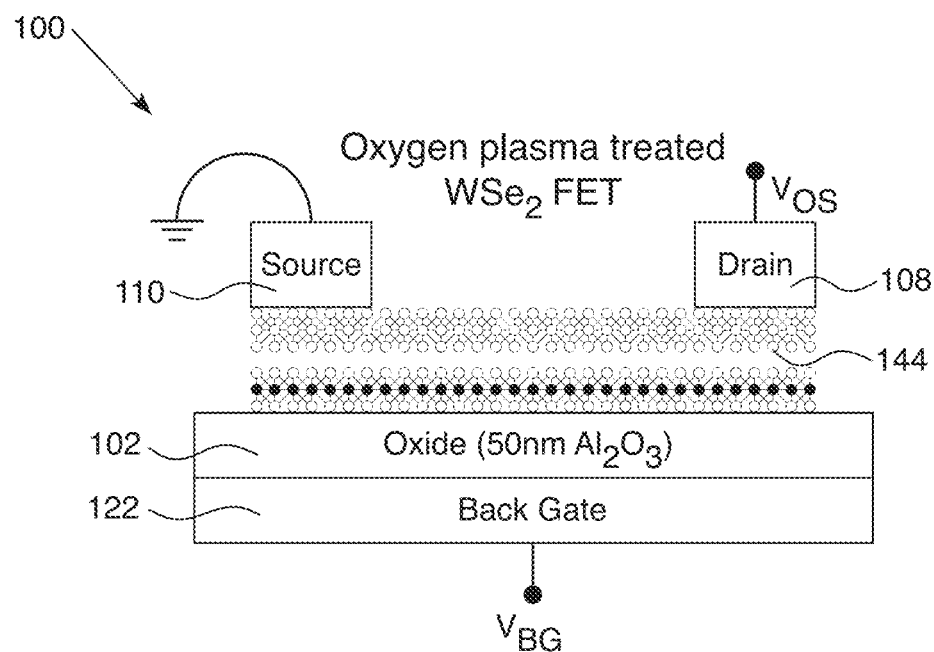
FIG. 20 shows a schematic of an embodiment of a p-type doped $WSe_2$ using oxygen plasma treated $WSe_2$ FET, along with the output characteristics of the $WSe_2$ FET.
Figure 20:
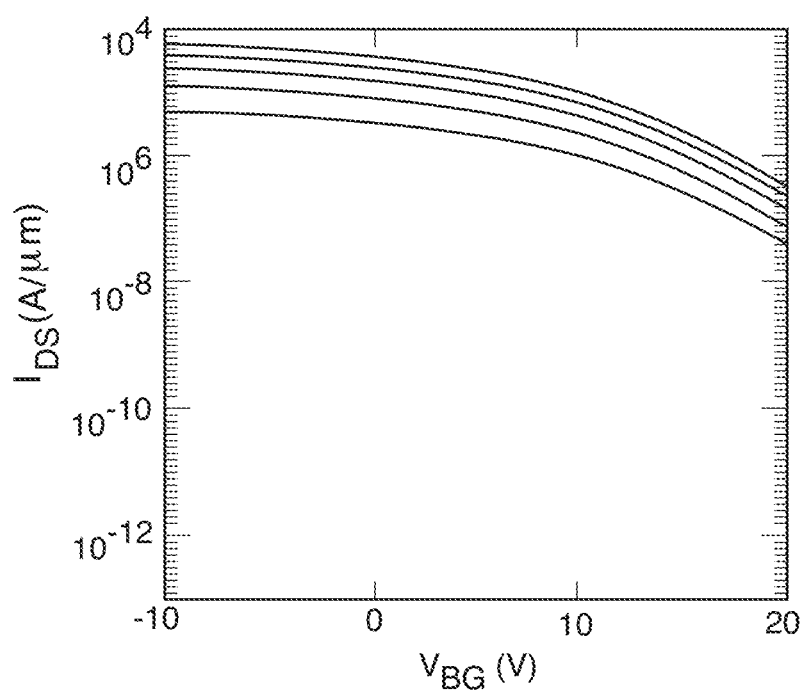
Figure 21:
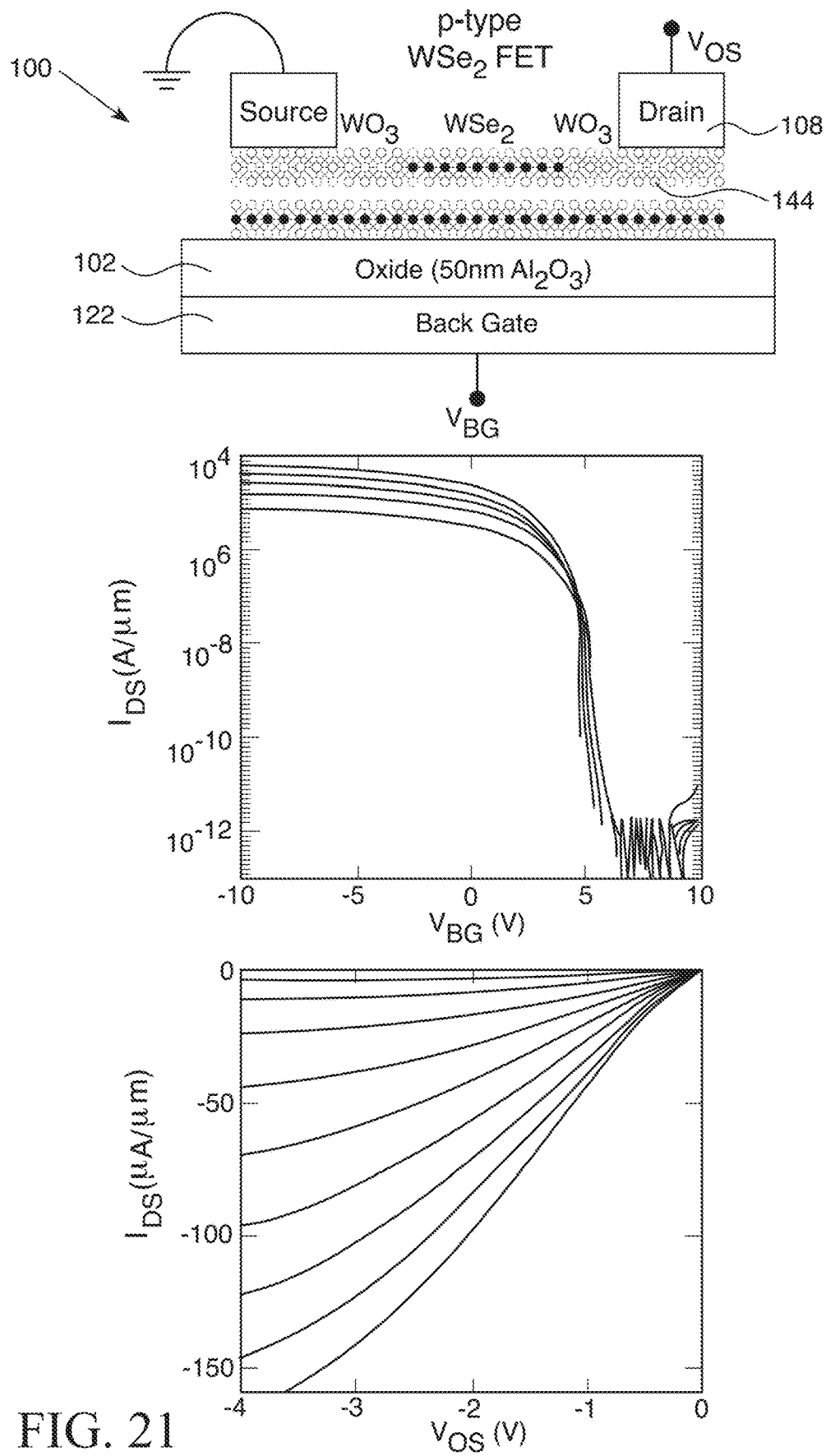
FIG. 21 shows a schematic of an embodiment of a p-type $WSe_2$ FET with a p-i-p structure, along with the transfer and output characteristics of the $WSe_2$ FET.

As noted above, fully tunable Gaussian synapse devices 100 require dual gated n-type and p-type 2D FETs operating in their corresponding subthreshold regimes. This was accomplished experimentally by using two different 2D materials, namely exfoliated $MoS_2$ and BP. However, since exfoliation is not a scalable technique, it is imperative that the choice of material be such that it can be grown over the entire chip area to enable hardware implementation of a PNN 124. While $MoS_2$ can be grown using CVD and MOCVD techniques at wafer scale, there is limited success on large growth of BP. Therefore, it may be beneficial to replace BP with a p-type 2D material that can be grown over a large area. One option is p-type doping of $MoS_2$, which will also avoid material integration issues. However, the phenomenon of metal Fermi level pinning close to the conduction band of $MoS_2$ and lack of any reliable doping scheme pose significant challenge in utilizing $MoS_2$ based high performance p-type FETs. $WSe_2$, however, offers ambipolar transport. FIG. 19 shows the transfer and output characteristics of an exfoliated $WSe_2$ FET, which is predominantly n-type. However, mild oxygen plasma treatment of the same device can lead to degenerate p-type doping as shown in FIG. 20. This is owning to a self-limiting oxidation process that converts the top expose layer of $WSe_2$ into high work function $WO_3$, which is known to be p-type dopant for $WSe_2$. A high-performance p-type $WSe_2$ can be realized by selectively doping the channel 144 near the source contact 110 interface and/or the drain contact 108 interface as shown in FIG. 21. Similarly, it has been reported that low work function and sub-stoichiometric alumina can be used for degenerate n-type doping of 2D Transition Metal Dichalcogenide monolayers (TMDCs).

Thus, the Gaussian synapse device 100 can include a substrate 102 having an upper surface 104 and a lower surface 106. A drain contact 108 can be formed on a portion of the upper surface 104. A source contact 110 can be formed on a portion of the upper surface 104. A channel 144 (e.g., $WSe_2$ channel) is formed between the source contact 110 and the drain contact 108. The channel 144 can be a $WSe_2$ channel with high work function $WO_3$ at or near the source contact 110 and the drain contact 108. A back-gate contact 122 can be formed on the lower surface 106.

Figure 22:
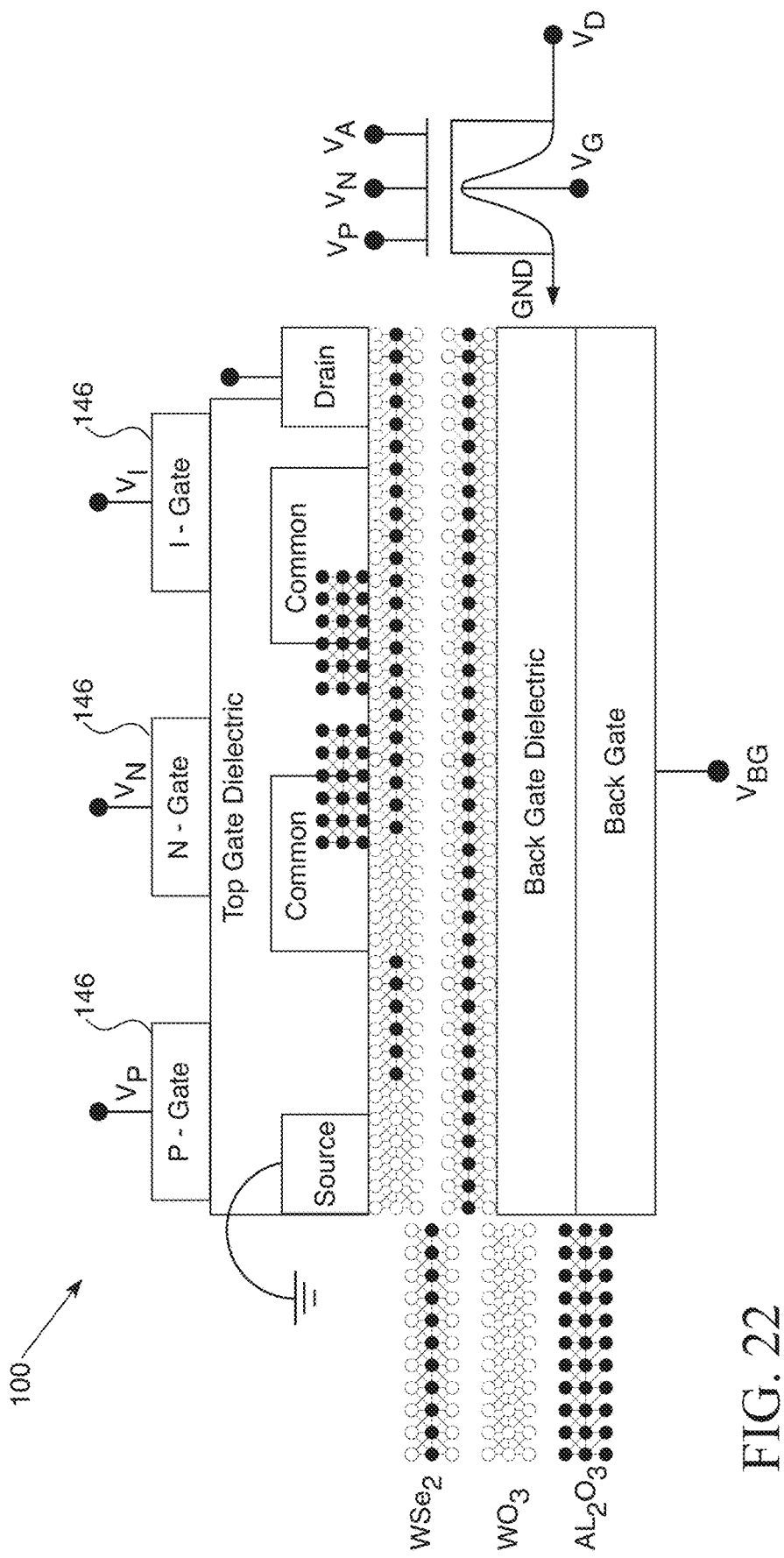
FIG. 22 shows a schematic of an embodiment of a Gaussian synapse based on $WSe_2$ FET, with an additional FET for $V_{DS}$ control.

As noted herein, the Gaussian synapse distribution is determined by A, µv, and σv. These are controlled by the two top gate voltages $V_N$ and $V_P$, for the n-type and p-type FETs, respectively, and the supply voltage $V_{DD}$. However, in an integrated circuit, it is not desirable to have variable $V_{DD}$. This can be circumvented by integrating another top-gated transistor 146 in series with the Gaussian synapse device 100. By controlling the resistance via the top gate voltage, it is possible to control the voltage drop across the Gaussian synapse. These series transistors are referred to herein as i-type $WSe_2$ FETs. FIG. 22 shows the schematic of a fully reconfigurable $WSe_2$ based Gaussian synapse device 100 and its equivalent circuit representation.

EXAMPLES

Exemplary Device Fabrication and Measurements:

$MoS_2$ and BP flakes were micromechanically exfoliated on 285 nm thermally grown $SiO_2$ substrates with highly doped Si as the back-gate electrode. The thicknesses of the $MoS_2$ and BP flakes were in the range of 3-20 nm. $MoS_2$ is a 2D layered material with the lattice parameters a=3.15Å°, b=3.15Å°, c=12.3Å°, α=90°, β=90° and γ=120°. The layered nature due to van der Waals (vdW) bonding results in a higher value for c. This enables mechanical exfoliation of the material to obtain ultra-thin layers of $MoS_2$. BP exhibits a puckered honeycomb lattice structure. It has phosphorous atoms existing on two parallel planes. The lattice parameters are given by a=3.31A°, b=10.47A°, c=4.37A°, α=90°, β=90° and γ=90°. The source/drain contacts were defined using electron-beam lithography (Vistec EBPG5200). Ni (40 nm) followed by Au (30 nm) was deposited using electron-beam (e-beam) evaporation for the contacts. Both devices were fabricated with a channel length of 1 µm. The width of the $MoS_2$ and BP devices were 0.78 µm and 2 µm, respectively. The top-gated devices were fabricated with hydrogen silsesquioxane (HSQ) as the top-gate dielectric. The top-gate dielectric was deposited by spin coating 6% HSQ in methyl isobutyl ketone (MIBK) (Dow Corning XR-1541-006) at 4000 rpm for 45 s and baked at 80° C. for 4 min. The HSQ was patterned using an e-beam dose of 2000 µC/$cm^2$ and developed at room temperature using 25% tetramethylammonium hydroxide (TMAH) for 30 s following a 90 s rinse in deionized water (DI). Next, the HSQ was cured in air at 180° C. and then 250° C. for 2 min and 3 min, respectively. The thickness of the HSQ layer, used as the top-gate dielectric was 120 nm. Top-gate electrodes with Ni (40 nm) followed by Au (30 nm) were patterned with the same procedure as the source and drain contacts. Given the instability of BP, special care was taken to ensure minimal exposure time to the air while fabricating BP devices by storing the material in vacuum chambers between different fabrication steps. Additionally, all the three lithography steps involved in the device fabrication were done within a period of 3 days. The electrical characterizations were obtained at room temperature in high vacuum (~10-6 Torr) a Lake Shore CRX-VF probe station and using a Keysight B1500A parameter analyzer.

It should be understood that the disclosure of a range of values is a disclosure of every numerical value within that range, including the end points. It should also be appreciated that some components, features, and/or configurations may be described in connection with only one particular embodiment, but these same components, features, and/or configurations can be applied or used with many other embodiments and should be considered applicable to the other embodiments, unless stated otherwise or unless such a component, feature, and/or configuration is technically impossible to use with the other embodiment. Thus, the components, features, and/or configurations of the various embodiments can be combined together in any manner and such combinations are expressly contemplated and disclosed by this statement.

It will be apparent to those skilled in the art that numerous modifications and variations of the described examples and embodiments are possible considering the above teachings of the disclosure. The disclosed examples and embodiments are presented for purposes of illustration only. Other alternate embodiments may include some or all of the features disclosed herein. Therefore, it is the intent to cover all such modifications and alternate embodiments as may come within the true scope of this invention, which is to be given the full breadth thereof.

It should be understood that modifications to the embodiments disclosed herein can be made to meet a particular set of design criteria. Therefore, while certain exemplary embodiments of the device and methods of using and making the same disclosed herein have been discussed and illustrated, it is to be distinctly understood that the invention is not limited thereto but may be otherwise variously embodied and practiced within the scope of the following claims.

What is claimed is:

1. A Gaussian synapse device, comprising:
a substrate having a source contact and a drain contact;
two channels formed between the source contact and the drain contact;
wherein:
the source contact connects to a p-type channel;
the drain contact connects to an n-type channel;
the p-type and n-type channels are connected in series;
a common contact
a first channel formed between the source contact and the common contact,
forming a p-type field-effect transistor (FET); and
a second channel formed between the drain contact and the common contact, forming an n-type FET.

2. The Gaussian synapse device of claim 1, wherein the first channel includes a first p-type atomically thin two-dimensional (2D) layered material and the second channel includes a second n-type atomically thin 2D layered material.

3. The Gaussian synapse device of claim 2, wherein the first p-type atomically thin 2D layered material comprises black phosphorus and the second n-type atomically thin 2D layered material comprises $MoS_2$.

4. The Gaussian synapse device of claim 1, wherein both channels include ambipolar transport material.

5. The Gaussian synapse device of claim 4, wherein the ambipolar transport material comprises $WSe_2$.

6. The Gaussian synapse device of claim 1, further comprising a back-gate.

7. The Gaussian synapse device of claim 6, further comprising at least one of: a first top-gate formed on the p-type FET; and a second top-gate formed on the n-type FET.

8. The Gaussian synapse device of claim 1, further comprising at least one top-gated transistor in Gaussian synapse device.

9. The Gaussian synapse device of claim 1, wherein the p-type FET is a tunneling field effect transistor (TFET) and the n-type FET is a TFET.

10. A method of forming a Gaussian synapse device, the method comprising:
forming a dielectric substrate having an upper surface and a lower surface;
forming a source contact on the upper surface;
forming a drain contact on the upper surface;
forming a first channel and a second channel between the source contact and the drain contact so that the source contact connects to a p-type semiconductor and the drain contact connects to an n-type semiconductor, wherein the first channel generates a p-type field effect transistor (FET) and the second channel generates an n-type FET, wherein the p-type FET and the n-type FET are connected in series.

11. A method of forming a Gaussian synapse device, the method comprising:
forming a dielectric substrate having an upper surface and a lower surface;
forming a source contact on the upper surface;
forming a drain contact on the upper surface;
forming a first channel and a second channel between the source contact and the drain contact so that the source contact connects to a p-type semiconductor and the drain contact connects to an n-type semiconductor, wherein the first channel generates a p-type field effect transistor (FET), wherein the drain contact and the second channel generate an n-type FET, wherein the p-type FET and the n-type FET are connected in series.

12. The method of claim 11, further comprising:
forming a common contact on the upper surface;
forming a p-type channel as the first channel between the source contact and the common contact to generate the p-type FET; and
forming a n-type channel as the second channel between the drain contact and the common contact to generate the n-type FET.

13. The method of claim 12, wherein:
forming the first channel involves generating a first p-type atomically thin two-dimensional (2D) layered material; and
forming the second channel involves generating a second n-type atomically thin 2D layered material.

14. The method of claim 13, wherein:
the first atomically thin 2D layered material comprises black phosphorus; and
the second atomically thin 2D layered material comprises $MoS_2$.

15. The method of claim 11, wherein each of the first channel and the second channel is formed using a single ambipolar transport material.

16. The method of claim 15, wherein the ambipolar transport material comprises $WSe_2$.

17. The method of claim 16, further comprising forming a back-gate on the lower surface.

18. The method of claim 17, further comprising forming at least one of: a first top-gate on the p-type FET; and a second top-gate on the n-type FET.

19. The method of clam 18, further comprising tuning the mean, the standard deviation, and the amplitude of the Gaussian shaped transfer characteristics of the Gaussian synapse device via adjustment of the top-gate voltage for the first top-gate and the top gate voltage for the second top-gate.

* * * * *